(12) United States Patent
Jiang et al.

(10) Patent No.: US 12,695,060 B2
(45) Date of Patent: Jul. 28, 2026

(54) CONTROL OF MASK CD

(71) Applicant: Lam Research Corporation, Fremont, CA (US)

(72) Inventors: Beibei Jiang, Alpharatte, GA (US); Taner Ozel, Fremont, CA (US); Chen Chen, Hayward, CA (US); Shuang Pi, Fremont, CA (US); Daksh Agarwal, Sunnyvale, CA (US); Qing Xu, Fremont, CA (US); Merrett Wong, San Carlos, CA (US); Amit Mukhopadhyay, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 676 days.

(21) Appl. No.: 18/011,477

(22) PCT Filed: Feb. 25, 2022

(86) PCT No.: PCT/US2022/018038
§ 371 (c)(1),
(2) Date: Dec. 19, 2022

(87) PCT Pub. No.: WO2022/192016
PCT Pub. Date: Sep. 15, 2022

(65) Prior Publication Data
US 2023/0230807 A1      Jul. 20, 2023

Related U.S. Application Data

(60) Provisional application No. 63/159,391, filed on Mar. 10, 2021.

(51) Int. Cl.
*H01J 37/32*      (2006.01)
*H10P 50/00*      (2026.01)
(Continued)

(52) U.S. Cl.
CPC .. *H01J 37/32183* (2013.01); *H01J 37/32146* (2013.01); *H10P 50/268* (2026.01);
(Continued)

(58) Field of Classification Search
CPC ........... H01J 37/32183; H01J 37/32146; H01J 2237/24578; H01J 2237/334;
(Continued)

(56) References Cited

U.S. PATENT DOCUMENTS 9,336,995 B2      5/2016  Common et al.
10,304,662 B2     5/2019  Marakhtanov et al.
(Continued)

OTHER PUBLICATIONS

Interview Agenda (Year: 2026).*
ISR & WO PCT/US2022/018038, dated Jun. 9, 2022, 15 pages.

*Primary Examiner* — Fernando L Toledo
*Assistant Examiner* — Jorge Andres Lopez
(74) *Attorney, Agent, or Firm* — Polygon IP, LLP

(57) ABSTRACT

A method for controlling a critical dimension of a mask layer is described. The method includes receiving a first primary parameter level, a second primary parameter level, a first secondary parameter level, a second secondary parameter level, and a third secondary parameter level. The method also includes generating a primary signal having the first primary parameter level, and transitioning the primary signal from the first primary parameter level to the second primary parameter level. The method further includes generating a secondary radio frequency (RF) signal having the first secondary parameter level, and transitioning the secondary RF signal from the first secondary parameter level to the second secondary parameter level. The method includes transitioning the secondary RF signal from the second secondary parameter level to the third secondary parameter level.

14 Claims, 7 Drawing Sheets

(System-lab)

(51) Int. Cl.
  *H10P 50/26*    (2026.01)
  *H10P 50/28*    (2026.01)
  *H10P 74/00*    (2026.01)

(52) U.S. Cl.
  CPC ............ *H10P 50/283* (2026.01); *H10P 50/71*
    (2026.01); *H10P 50/73* (2026.01); *H10P 74/23*
    (2026.01); *H01J 2237/24578* (2013.01); *H01J*
              *2237/334* (2013.01)

(58) Field of Classification Search
  CPC .......... H01J 37/32174; H01J 37/32165; H01L
        21/31116; H01L 21/31144; H01L
      21/32137; H01L 21/32139; H01L 22/20
  See application file for complete search history.

(56)        References Cited

U.S. PATENT DOCUMENTS

| | | | |
|---|---|---|---|
| 11,688,586 B2 * | 6/2023 | Ventzek ............ | H01J 37/32082 |
| | | | 438/798 |
| 12,057,294 B2 * | 8/2024 | Koshimizu ....... | H01J 37/32082 |
| 2017/0084432 A1 | 3/2017 | Valcore, Jr. et al. | |
| 2017/0103873 A1 | 4/2017 | Kawasaki | |
| 2017/0207099 A1 | 7/2017 | Ohtake et al. | |

* cited by examiner (System-lab)

(Clock)

(Sx & Sy -Lab)

(S2y Follow S0y)

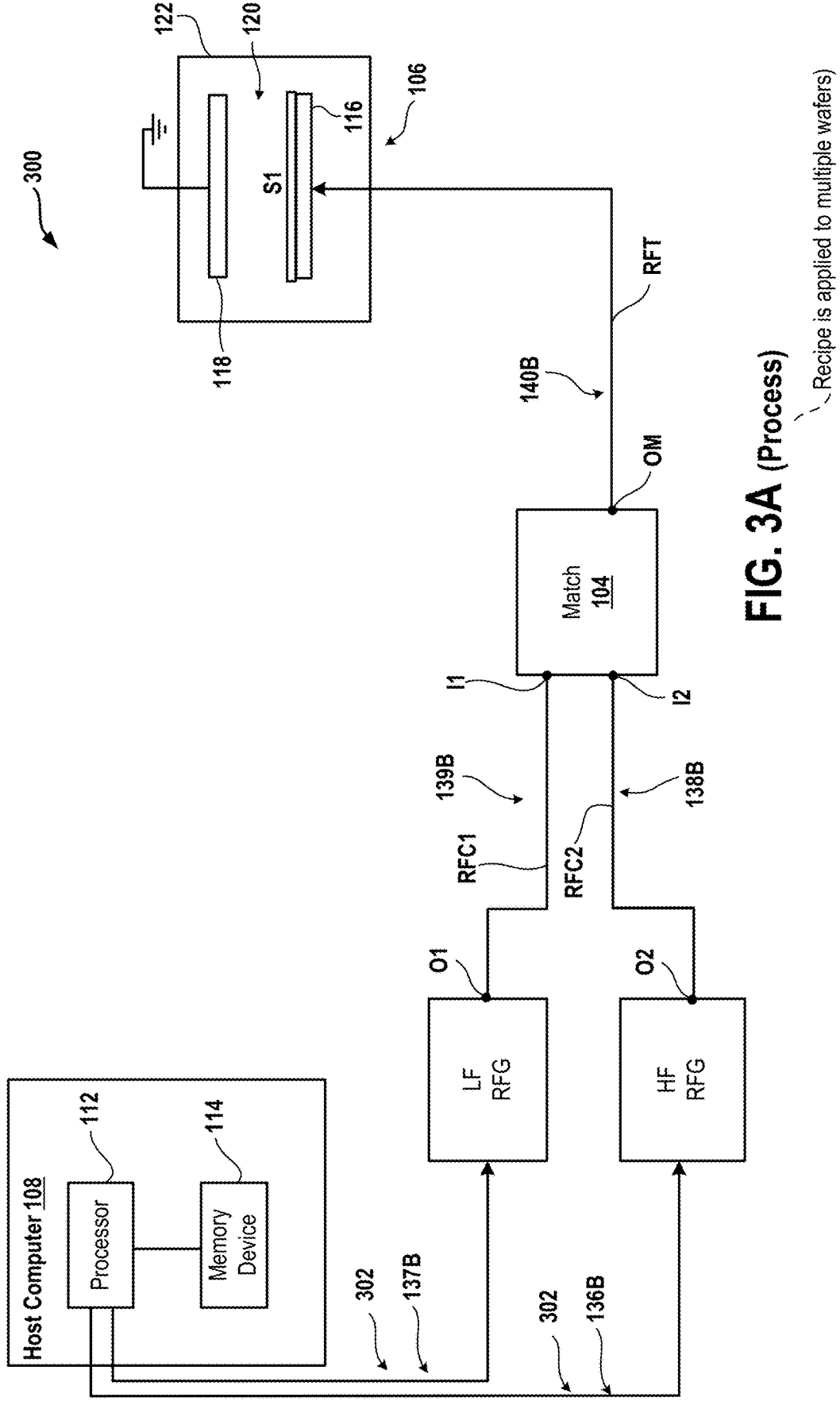
FIG. 3A (Process)
Recipe is applied to multiple wafers)

(Recipe-Process)

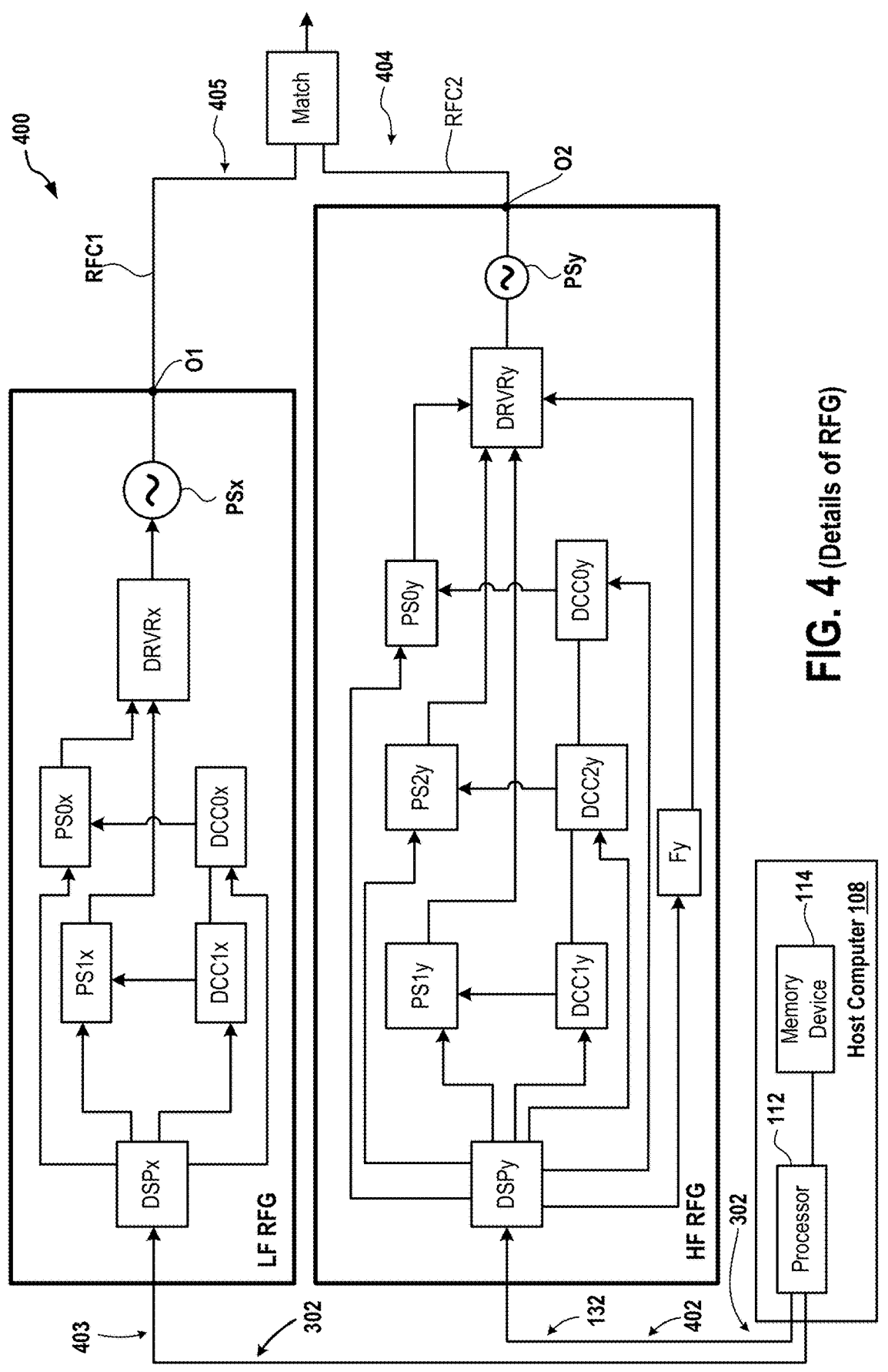
FIG. 4 (Details of RFG)

CONTROL OF MASK CD

CLAIM OF PRIORITY

This application is a national stage filing of and claims priority, under 35 U.S.C. § 371, to PCT/US22/18038, filed on Feb. 25, 2022, and titled "CONTROL OF MASK CD", which claims the benefit of and priority, under 35 U.S.C. § 119(e), to U.S. Provisional Patent Application No. 63/159, 391, filed on Mar. 10, 2021, all of which are incorporated by reference herein in their entirety.

FIELD

The present embodiments relate to systems and methods for controlling a critical dimension (CD) of a mask layer.

BACKGROUND

A plasma tool includes a radio frequency (RF) generator, a match network, and a plasma reactor. The RF generator is coupled via the match network to the plasma reactor. A wafer is placed within the plasma chamber to be etched.

The RF generator generates an RF signal, which is supplied to the match network. The match network reduces reflected power towards the RF generator and provides an output RF signal to the plasma reactor. The output RF signal is used to etch the wafer. However, sometimes, a different process result than that desired may be achieved with the output RF signal.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for controlling a critical dimension (CD) of a mask layer of a substrate. It should be appreciated that the present embodiments can be implemented in numerous ways, e.g., a process, an apparatus, a system, a device, or a method on a computer readable medium. Several embodiments are described below.

In one embodiment, in a high aspect ratio (HAR) contact etch, an adequate process margin should be maintained while trying to selectively etch a stack layer as compared to a mask layer. As an example, the stack layer includes iterating oxide and poly-silicon layers and the mask layer has carbon. Mask selectivity is tied to a polymerizing species that is proximate to the mask layer. The polymerizing species limits a size of a mask opening, which limits the process margin. The methods, described herein, control a mask etch rate while improving a tradeoff between selectivity and the process margin.

In case of two-level radio frequency (RF) pulsing, a process for turning power of both bias and flux to a low level or off in a second level may increase mask selectivity when the low level or off state is set to be long enough. However, this process sometimes increases a risk of mask clogging due to more passivation at a top of the mask. The low level or off state is sometimes referred to herein as a low level/off state.

A chemistry attempt to widen a process capping margin may worsen the mask selectivity, ending up with a reduction of benefits of mask selectivity from the two-level RF pulsing. Leaner chemistry with less polymer source is an effective knob to widen the process margin and remove the mask clogging. However, this chemistry approach has tradeoffs with other parameters, such as worse profile with bigger maximum critical dimension (CD), and less mask remaining due to worse mask selectivity.

The methods, described herein, include multi-state pulsing. In multi-state pulsing, a third pulsing operation with no bias and low flux regime is added to the low level/off state. By adding the third pulsing operation, a trade-off with mask clogging is addressed while improving mask selectivity significantly.

The no bias and low flux regime generates plasma that can reach to the top of mask and removes polymers deposited during the low level/off state on the top and neck area of the substrate. In the multistate pulsing, the no bias and low flux regime is implemented as a third state, which can be inserted either before or after the low level/off state, which is a neck forming state. During each cycle, the no bias and low flux regime trims and straightens the neck, eliminates an accumulation effect of mask clogging, and eventually widens the process capping margin. As a result, both the benefits of mask selectivity coming from the low level/off state and the benefits of widened process margin can be maintained. The no bias and low flux regime is provided as a method to remove mask clogging, and offers a lot of flexibility to choices of chemistry.

In one embodiment, a method for controlling a critical dimension of a mask layer is described. The method includes receiving, by a primary generator, a first primary parameter level and a second primary parameter level. The method further includes receiving, by a megahertz RF generator, a first secondary parameter level, a second secondary parameter level, and a third secondary parameter level. The method also includes generating, by the primary generator, a primary signal having the first primary parameter level. The method includes transitioning, by the primary generator during a clock cycle, the primary signal from the first primary parameter level to the second primary parameter level. The method further includes generating, by the secondary RF generator, a secondary RF signal having the first secondary parameter level. The method also includes transitioning, by the secondary RF generator, the secondary RF signal from the first secondary parameter level to the second secondary parameter level during the clock cycle. The method includes transitioning, by the secondary RF generator, the secondary RF signal from the second secondary parameter level to the third secondary parameter level during the clock cycle. The operation of transitioning of the primary signal from the first primary parameter level to the second primary parameter level occurs in synchronization with the operation of transitioning of the secondary RF signal from the first secondary parameter level to the second secondary parameter level. The second secondary parameter level is generated to control the critical dimension of the mask layer.

In an embodiment, a controller for controlling a critical dimension of a mask layer is described. The controller includes a processor and a memory device. The processor receives a first primary parameter level, a second primary parameter level, a first secondary parameter level, a second secondary parameter level, and a third secondary parameter level. The processor controls a primary generator to generate a primary signal having the first primary parameter level.

The processor controls the primary generator to transition, during a clock cycle, the primary signal from the first primary parameter level to the second primary parameter level. The processor controls a secondary RF generator to generate a secondary RF signal having the first secondary parameter level. The processor controls the secondary RF generator to transition the secondary RF signal from the first secondary parameter level to the second secondary parameter level during the clock cycle. The processor further controls the secondary RF generator to transition the secondary RF signal from the second secondary parameter level to the third secondary parameter level during the clock cycle. The primary signal is controlled to transition from the first primary parameter level to the second primary parameter level in synchronization with the transition of the secondary RF signal from the first secondary parameter level to the second secondary parameter level. Also, the second secondary parameter level is generated to control the critical dimension of the mask layer. The memory device stores the first primary parameter level, the second primary parameter level, the first secondary parameter level, the second secondary parameter level, and the third secondary parameter level.

A plasma system for controlling a critical dimension of a mask is described. The plasma system includes a primary generator, which receives a first primary parameter level and a second primary parameter level. The plasma system further includes a secondary RF generator, which receives a first secondary parameter level, a second secondary parameter level, and a third secondary parameter level. The primary generator generates a primary signal having the first primary parameter level. Also, the primary generator transitions, during a clock cycle, the primary signal from the first primary parameter level to the second primary parameter level. The secondary RF generator generates a secondary RF signal having the first secondary parameter level. Furthermore, the secondary RF generator transitions the secondary RF signal from the first secondary parameter level to the second secondary parameter level during the clock cycle. The secondary RF generator transitions the secondary RF signal from the second secondary parameter level to the third secondary parameter level during the clock cycle. The transition of the primary signal from the first primary parameter level to the second primary parameter level occurs in synchronization with the transition of the secondary RF signal from the first secondary parameter level to the second secondary parameter level. The second secondary parameter level is generated to control the critical dimension of the mask. The plasma system further includes an impedance matching circuit coupled to the primary generator and the secondary RF generator. The impedance matching circuit receives the primary signal and the secondary RF signal to output a modified RF signal. The plasma system includes a plasma chamber coupled to the impedance matching circuit. The plasma chamber receives the modified RF signal to control the critical dimension of the mask layer.

Several advantages of the herein described systems and methods include reducing clogging at the mask layer. By introducing a middle state between two states of a high frequency (HF) RF generator, the clogging at the mask layer is reduced. An HF RF signal generated by the HF RF generator transitions from a first state to a second state, such as the middle state, and then from the middle state to a third state. The transition from the first state to the second state occurs in synchronization with a transition of a low frequency (LF) RF signal from a first state to a second state. By pulsing the LF and HF RF signals in such a manner, the clogging at the mask layer is reduced.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 3A is a diagram of an embodiment of a system to illustrate that once an additional HF recipe is determined, the additional HF recipe is applied to one or more substrates during processing of the substrates.

FIG. 4 is a diagram of an embodiment of the LF RF generator and the HF RF generator to illustrate details of the RF generators.

DETAILED DESCRIPTION

Figure 1:
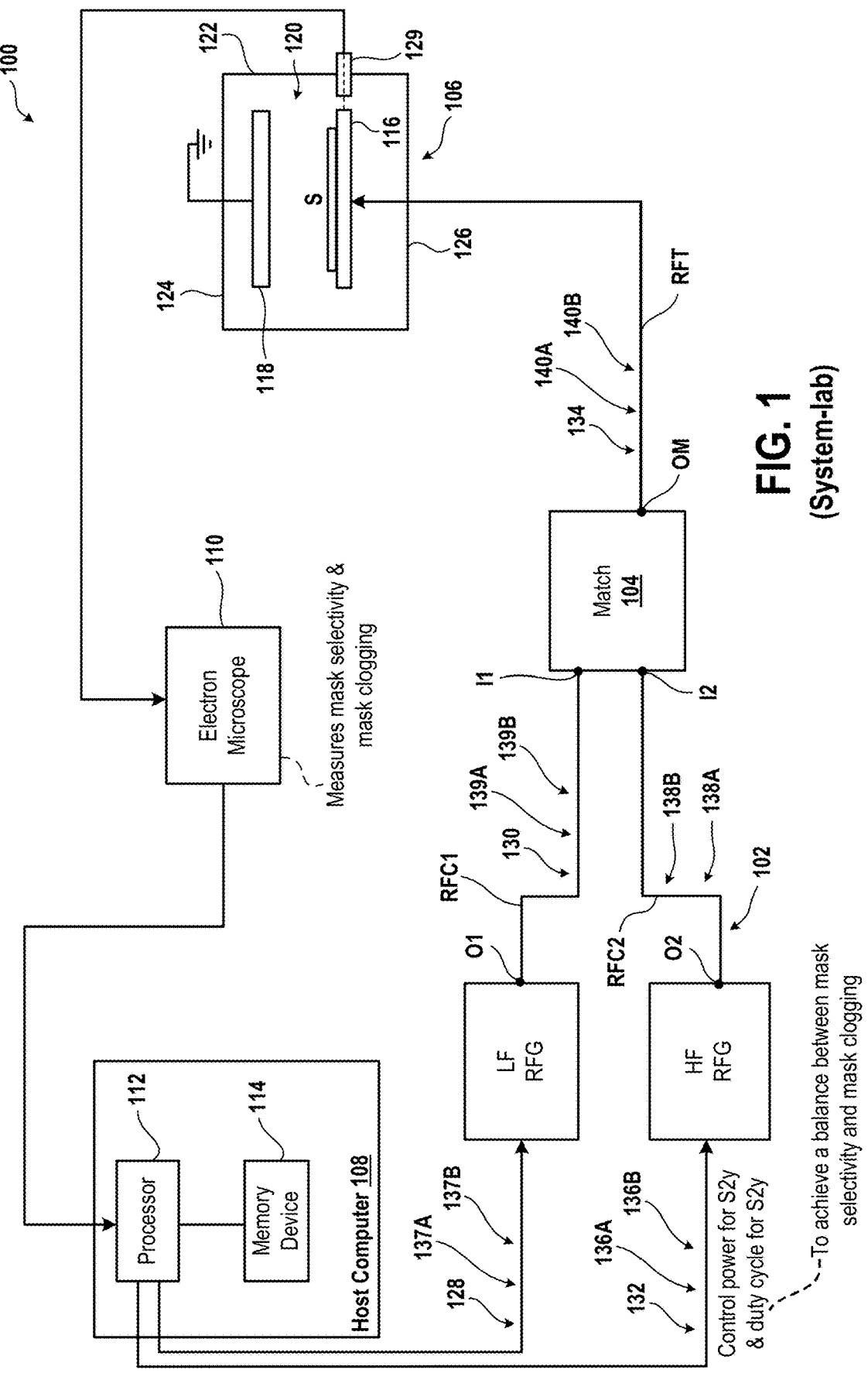
FIG. 1 is a diagram of an embodiment of a system to illustrate a lab routine for determination of a parameter level and a duty cycle of a parameter state of a radio frequency (RF) signal generated by a high frequency (HF) RF generator.

The following embodiments describe systems and methods for controlling a critical dimension (CD) of a mask layer of a substrate. It will be apparent that the present embodiments may be practiced without some or all of these specific details. In other instances, well known operations have not been described in detail in order not to unnecessarily obscure the present embodiments.

In level-to-level RF pulsing, which is two-state pulsing, turning off both bias and flux in an s0 state may bring more passivation from polymers. The s0 state is sometimes referred to herein as a zero watts-s0 regime (0 W-s0) regime. The passivation mainly happens on top of a mask, may reduce a mask etch rate, and may increase mask selectivity. A top mask CD may reduce as a result of more passivation, causing necking and mask clogging.

By chemistry optimization or adjustment, mask clogging is reduced, but selectivity benefits, such as an etch rate, may reduce as well. For example, if capping is caused by mask terracing and deposition at a neck area of the substrate, the chemistry optimization or adjustment can reduce a risk of mask clogging. However, the chemistry adjustment may reduce the selectivity benefits. The chemistry optimization or adjustment is sometimes referred to herein as a chemistry approach.

The methods, described herein, for controlling the CD include a no bias/low flux regime, which generates plasma that can reach to a top of the mask, trim and straighten the neck area by removing the polymers deposited in the top and the neck area. The methods for controlling the CD reduce the mask clogging risk and widen a process margin. The no bias/low flux regime is implemented as a combination of an S0x state and an S2y state, which is a third state in multi-state pulsing. The widened process margin brings potential benefits of better mask selectivity or better max CD. Particularly, the widened process margin brings a luxury of implementing 0 watts as the S0x state, which significantly increases the mask selectivity while maintaining a healthy process margin. Therefore, multi-state pulsing with 0 watts in the S0x state and the no bias/low flux regime as the third state break a tradeoff of mask selectivity versus mask clogging. The multi-state pulsing simplifies a process of widening the process margin and adds more flexibility to a choice of chemistry gas.

Depending on the level of mask clogging during the S0x state, the no bias/low flux regime in the multi-state pulsing can be controlled to minimize the tradeoff while maintaining the benefits in both process margin and mask selectivity. Flux power in the no bias/low flux regime can be used to control the CD at the neck and a shape of the neck. The control of the CD can provide an increase in an etch rate due to a widening of the neck and improves an aspect ratio. A flux extension factor is another knob to control an amount, such as a duty cycle, of the S2y state and a duty cycle of the S0x state. Such tunability provides easy control of a balance between the etch rate and mask selectivity.

The methods, described herein, for controlling the CD provide a way to break the tradeoff of mask selectivity versus mask clogging. In the chemistry approach to address the mask clogging, the tradeoff occurs, such as worse or decreased mask selectivity. In the method for controlling the CD, since the no bias/low flux regime is implemented as the third state together with the zero watts as the state S0x, benefits of the mask selectivity coming from the state S0x and the benefits of a healthy mask coming from the no bias/low flux regime can be maintained during the same clock cycle. Such controllability in mask clogging removal while maintaining high mask selectivity offers more flexibility to the choice of mask type and mask thickness, which further reduces cost of fabricating the substrate.

FIG. 1 is a diagram of an embodiment of a system 100 to illustrate a lab routine for determination of a parameter level and a duty cycle of a state S1y of a parameter of an RF signal 104 that is generated by a high frequency (HF) radio frequency (RF) generator. Examples of the parameter include power and voltage. An example of a duty cycle of a parameter level includes a time period for which parameter level is maintained.

The system 100 includes a low frequency (LF) RF generator, the HF RF generator, a match 104, a plasma chamber 106, a host computer 108, and an electron microscope 110. An illustration of the LF RF generator is an RF generator having a low frequency of operation of 100 kilohertz (kHz), or 400 kHz, or 1 megahertz (MHz), or 2 MHz. An illustration of the HF RF generator is an RF generator having a high frequency of operation of 2 MHz, 13.56 MHz, 27 MHz, 60 MHz, or 120 MHz. To further illustrate, the HF RF generator has a higher frequency than a frequency of operation of the LF RF generator. The LF RF generator is an example of a primary generator and the HF RF generator is an example of a secondary RF generator.

The match 104 is sometimes referred to herein as an impedance matching circuit or an impedance matching network. As an example, the match 104 includes a network of circuit components that are coupled to each other. An example of a circuit component is a resistor, an inductor, or a capacitor.

Examples of the host computer 108 include a desktop computer, a laptop computer, a tablet, a smart phone, and a controller. The host computer 108 includes a processor 112 and a memory device 114. As an example, the processor 112 can be a central processing unit (CPU), a combination of the CPU and a graphical processing unit (GPU), a field programmable gate array (FPGA), an application specific integrated circuit (ASIC), a programmable logic device (PLD), or a microcontroller. Examples of the memory device 114 include a read-only memory (ROM) and a random access memory (RAM). The processor 112 is coupled to the memory device 114.

The plasma chamber 106 includes a substrate support 116, such as an electrostatic chuck (ESC). The plasma chamber 106 further includes an upper electrode 118 that is located above the substrate support 116 to form a gap 120 between the upper electrode 118 and the substrate support 116. A lower electrode, embedded within the substrate support 116, is made from a metal, such as aluminum or an alloy of aluminum. The substrate support 116 is made from the metal and from ceramic, such as aluminum oxide ($Al_2O_3$). The upper electrode 118 is fabricated from the metal and is coupled to a reference potential, such as a ground potential or a negative potential. An example of the plasma chamber 106 is a capacitively coupled plasma (CCP) chamber.

As an example, the electron microscope 110 uses a beam of electrons and their wave-like characteristics to magnify an image of a substrate S. To illustrate, the electron microscope 110 can resolve features of the substrate S that are more than 1 million times smaller. Examples of the electron microscope 110 include a transmission electron microscope (TEM), a scanning electron microscope (SEM), and a scanning transmission electron microscope (STEM). An example of a substrate, as used herein, includes a semiconductor wafer having multiple layers. To illustrate, the substrate includes multiple layers that form an integrated circuit, such as an ASIC or a PLD. The processor 112 is coupled to the LF RF generator, the HF RF generator, and the electron microscope 110.

An output O1 of the LF RF generator is coupled to an input I1 of the match 104 via an RF cable RFC1. Also, an output OM of the match 104 is coupled via an RF transmission line RFT to the lower electrode of the substrate support 116. An example of the RF transmission line RFT includes an RF cable that is surrounded by an RF sheath, with an insulator between the RF cable and the RF sheath.

The plasma chamber 106 has a side wall 122, a top wall 124, and a bottom wall 126. The side wall 122 is located between the top wall 124 and the bottom wall 126. The side wall 122 is fitted with the top wall 124 and the bottom wall 126. A slot 129 extends through the side wall 122.

The processor 114 generates a recipe signal 128 and sends the recipe signal 128 to the LF RF generator. The recipe signal 128 includes LF recipe information, such as, a number of states of the parameter of an RF signal 130 to be generated by the LF RF generator, a parameter level for each state of the RF signal 130, a duty cycle of each of the states, and a frequency of the RF signal 130. Similarly, the processor 114 generates a recipe signal 132 and sends the recipe signal 132 to the HF RF generator. The recipe signal 132 includes a number of states of the parameter of an RF signal 102 to be generated by the HF RF generator, a parameter level for each state of the RF signal 102, a duty cycle of each of the states, and a frequency of the RF signal 102.

After receiving the recipe signal 128, the LF RF generator generates the RF signal 130 based on the parameter levels for the number of states received within the recipe signal 128. For example, the RF signal 130 has two states and each of the two states has a corresponding one of the parameter levels received within the recipe signal 128. The RF signal 130 also has the frequency received within the recipe signal 128. Also, after receiving the recipe signal 132, the HF RF generator generates the RF signal 102 having the parameter levels for the number of states received within the recipe signal 132. For example, the RF signal 102 has two states and each state has a corresponding one of the parameter levels received within the recipe signal 132. The RF signal 130 also has the frequency received within the recipe signal 128.

The RF signal 130 is sent from the output O1 via the RF cable RFC1 and the input I1 to the match 104. Also, the RF signal 102 is sent from the output O2 via the RF cable RFC2 and the input I2 to the match 104.

The match 104 receives the RF signals 130 and 102, and matches an impedance of a load coupled to the output OM with an impedance of a source coupled to the inputs I1 and I2. The impedance matching modifies impedances of the RF signals 130 and 102 to output a modified RF signal 134 at the output OM. An example of the load includes the RF transmission line RFT and the plasma chamber 106. An example of the source coupled to the inputs I1 and I2 includes the LF RF generator, the RF cable RFC1, the HF RF generator, and the RF cable RFC2. The modified RF signal 134 is sent from the output OM via the RF transmission line RFT to the lower electrode of the substrate support 116.

When one or more process gases are supplied to the gap 120 within the plasma chamber 106 in addition to the modified RF signal 134, plasma is stricken or maintained within the gap 134 to process the substrate S. Examples of processing the substrate S include depositing a material on the substrate S, etching a layer of the substrate S, cleaning the substrate S, and sputtering the substrate S. Examples of the one or more process gases include an oxygen containing gas, a fluorine containing gas, and a combination thereof. To illustrate, the one or more process gases include carbon and hydrogen, e.g., $CHF_3$. As another illustration, when an amount of the carbon and hydrogen is reduced, a hydrogen gas or nitrogen triflouride (NF3) gas can be used as the one or more process gases.

Upon processing the substrate S for a predetermined amount of time, such as 15 minutes or 20 minutes, the substrate S is removed from the plasma chamber 106 via the slot 129. As an example, it takes an hour or so for the substrate S to finish processing. The substrate S is then placed under the electron microscope 110 to be examined ex-situ by a user. For example, when the substrate S is placed under the electron microscope 110, an image of features of the substrate S generated or captured by the electron microscope 110 is displayed by the processor 112 on a display device of the host computer 108. Examples of the display device include a liquid crystal display (LCD), a light emitting diode (LED) display, and a plasma display. The display device of the host computer 108 is coupled to the processor 112 of the host computer 108.

A determination is made, either by the user or by the processor 112, whether an amount of clogging of a mask layer of the substrate S is greater than a predetermined clog amount or whether a shape of profile of the mask layer is of a predetermined shape or a combination thereof. For example, the user measures, from the displayed image, a critical dimension (CD), such as a width, at a neck of the substrate S to determine whether the CD is less than a predetermined CD. In the example, the user provides the CD via an input device of the host computer 108 to the processor 112. Further, in the example, the processor 112 stores the CD in the memory device 114. Also, in the example, when the CD is less than the predetermined CD, the amount of clogging of the mask layer is greater than the predetermined clog amount. In the example, the predetermined CD is stored in the memory device 114. Further, in the example, on the other hand, when the CD is greater than the predetermined CD, the amount of clogging of the mask layer is less than the predetermined clog amount. In the example, the determination of whether the CD is greater than the predetermined CD is made by the user.

As another example, the processor 112, from the captured image, measures a CD at a neck of the substrate S to determine whether the CD is less than a predetermined CD. Further, in the example, the processor 112 stores the CD in the memory device 114. Also, in the example, when the CD is less than the predetermined CD, the processor 112 determines that the amount of clogging of the mask layer is greater than the predetermined clog amount. Further, in the example, on the other hand, when the CD is greater than the predetermined CD, the processor 112 determines that the amount of clogging of the mask layer is less than the predetermined clog amount.

As yet another example, the user measures, from the displayed image, CDs at multiple places at the neck of the substrate. In the example, the user measures a first CD at a first horizontal level at the neck and a second CD at a second horizontal level at the neck. The second horizontal level is lower than the first horizontal level. Continuing with the example, the user provides the two CDs to the processor 112 via the input device. In the example, the processor 112 stores the two CDs in the memory device 114. Also, in the example, when the first CD is outside a preset range from a first preset CD and the second CD is outside the preset range from a second preset CD, a shape of the profile of the mask layer is not of the predetermined shape. In the example, on the other hand, when the first CD is within the preset range from the first preset CD and the second CD is within the preset range from the second preset CD, a shape of the profile of the mask layer is of the predetermined shape. In the example, the first preset CD, the preset range, and the second preset CD are stored in the memory device 114. Further, in the example, the first preset CD, the preset range, and the second preset CD define the predetermined shape. Also, in the example, the determination of whether first CD is within the preset range from the first preset CD and the second CD is within the preset range from the second preset CD is made by the user or by the processor 112. It should be noted that as another example, CDs can be measured at more than two horizontal levels at the neck for comparison with the same number of preset CDs.

As still another example, the processor 112 measures, from the captured image, CDs at multiple places at the neck of the substrate. In the example, the processor 112 measures the first CD at the first horizontal level at the neck and the second CD at the second horizontal level at the neck. In the example, the processor 112 stores the two CDs in the memory device 114. Also, in the example, when the first CD is outside a preset range from a first preset CD and the second CD is outside the preset range from a second preset CD, the processor 112 determines that the shape of the profile of the mask layer is not of the predetermined shape. In the example, on the other hand, when the first CD is within the preset range from the first preset CD and the second CD is within the preset range from the second preset CD, the processor 112 determines that the shape of the profile of the mask layer is of the predetermined shape.

Upon determining that amount of clogging is greater than the predetermined clog amount or the shape of profile of the mask layer is not of the predetermined shape or a combination thereof, a recipe of the RF signal 102 is modified by the user via the input device or by the processor 112 to provide a HF recipe. For example, the user or the processor 112 introduces a middle state between the two states of the RF signal 102. To illustrate, when the two states of the RF signal 102 are S1y and S0y, the user provides HF recipe information regarding the middle state S2y between the two states S1y and S0y. To further illustrate, the user provides a parameter level and a duty cycle of the middle state S2y to the processor 112 via the input device. In the further illustration, remaining data is the same as that within the recipe signal 132. Also, in the further illustration, by introducing the middle state, a duty cycle of the state S1y is reduced. In the further illustration, the user provides the duty cycle of the state S1y and a parameter level for the state S1y to the processor 112 via the input device. In the further illustration, the user provides a parameter level for the state S0y to the processor 112 via the input device. In the example, the user provides the HF recipe to the processor 112 via the input device. Also, in the example, processor 112 stores the HF recipe in the memory device 114. As another example, the processor 112 introduces the middle state and sets the parameter level and the duty cycle of the middle state S2y instead of the user. Also, in the example, the processor 112 sets the parameter level for the state S0y instead of the user.

Examples of the input device include a mouse, a stylus, a keyboard, and a keypad. The input device is coupled to the processor 112 of the host computer 108.

Also, upon changing the recipe of the RF signal 102 to provide the HF recipe, the LF recipe information used to generate the RF signal 130 is modified by the user or by the processor 112 to output a LF recipe. For example, the user modifies a duty cycle of a state S1x of the RF signal 130 to be equal to the duty cycle of the state S1y within the HF recipe. Also in the example, the user does not modify any other data, such as parameter levels, within the LF recipe information. In the example, the user provides the LF recipe to the processor 112 via the input device. Further, in the example, the processor 112 stores the LF recipe in the memory device 114. As another example, the processor 112, instead of the user, modifies a duty cycle of a state S1x of the RF signal 130 to be equal to the duty cycle of the state S1y within the HF recipe. Also in the example, the processor 112 does not modify any other data, such as parameter levels, within the LF recipe information. Further, in the example, the processor 112 stores the LF recipe in the memory device 114

In addition to modifying the recipe of the RF signal 102 and modifying the recipe of the RF signal 130, the substrate S is placed back on top of the substrate support 116 via the slot 129. Upon receiving or generating the HF recipe, the processor 112 generates a recipe signal 136A based on the HF recipe and sends the recipe signal 136A to the HF RF generator. Also, in response to receiving or generating the LF recipe, the processor 112 generates a recipe signal 137A and sends the recipe signal 137A to the LF RF generator.

Upon receiving the recipe signal 136A, the HF RF generator generates an RF signal 138A based on the HF recipe. For example, the RF signal 138A has three parameter levels, one for each of the three states S1y, S2y, and S0y. The HF RF generator supplies the RF signal 138A via the output O2 and the RF cable RFC2 and the input I2 to the match 104.

Also, upon receiving the recipe signal 137A, the LF RF generator generates an RF signal 139A based on the LF recipe. For example, the state S1x of the RF signal 139A has a duty cycle that is equal to a duty cycle of the RF signal 138A. The LF RF generator supplies the RF signal 139A via the output O2 and the RF cable RFC1 and the input I1 to the match 104.

The match 104 receives the RF signals 138A and 139A, and matches an impedance of the load coupled to the output OM with the impedance of the source coupled to the inputs I1 and I2. The impedance matching changes impedances of the RF signals 138A and 139B to output a modified RF signal 140A at the output OM. The modified RF signal 140A is sent from the output OM via the RF transmission line RFT to the lower electrode of the substrate support 116.

When the one or more process gases are provided to the gap 120 within the plasma chamber 106 in addition to the modified RF signal 140A, the substrate S is further processed within the plasma chamber 106. Upon processing the substrate S for a preset amount of time, such as 15 minutes or 20 minutes, the substrate S is removed from the plasma chamber 106 via the slot 129 and is then placed under the electron microscope 110 to be examined ex-situ by the user. When the substrate S is placed under the electron microscope 110, an image is captured or generated by the electron microscope 110 and displayed by the processor 112 on the display device of the host computer 108.

The user or the processor 112 determines whether an amount of clogging of the mask layer of the substrate S is greater than the predetermined clog amount or a shape of the mask layer is of the predetermined shape or a combination thereof. For example, the user again measures, from the displayed image, a CD at the neck of the substrate S to determine whether the CD is less than the predetermined CD, and provides the CD via the input device to the processor 112. In the example, when the CD, measured again, is less than the predetermined CD as determined by the user, the amount of clogging of the mask layer is greater than the predetermined clog amount. Further, in the example, on the other hand, when the CD, measured again, is greater than the predetermined CD as determined by the user, the amount of clogging of the mask layer is less than the predetermined clog amount. In the example, the processor 112 stores the CD, measured again, in the memory device 114. As another example, the processor 112 again measures, from the captured image, a CD at the neck of the substrate S to determine whether the CD is less than the predetermined CD. In the example, when the CD, measured again, is less than the predetermined CD as determined by the processor 112, the amount of clogging of the mask layer is greater than the predetermined clog amount. Further, in the example, on the other hand, when the CD, measured again, is greater than the predetermined CD as determined by the processor 112, the amount of clogging of the mask layer is less than the predetermined clog amount. In the example, the processor 112 stores the CD, measured again, in the memory device 114.

As yet another example, the user measures, from the displayed image, CDs at multiple places at the neck of the substrate in the same manner as that before to decide whether the shape of the mask layer is of the predetermined shape. As still another example, the processor 112 measures, from the captured image, CDs at multiple places at the neck of the substrate before to determine whether the shape of the mask layer is of the predetermined shape.

Upon determining that the amount of clogging is greater than the predetermined clog amount or the shape of the mask layer is not of the predetermined shape or a combination thereof, the HF recipe of the RF signal 138A is modified by the user via the input device or by the processor 112 to provide an additional HF recipe. For example, the user modifies a parameter level or a duty cycle or both the parameter level and the duty cycle of the middle state S2y between the two states of the RF signal 138A. To illustrate, the user increases or decreases a parameter level of the middle state S2y of the RF signal 138A. In the illustration, remaining data is the same as that within the HF recipe used to generate the recipe signal 136A. To further illustrate, the user selects the parameter level of the middle state S2y to be between 100 and 1000 watts. As another illustration, the user increases or decreases a duty cycle of the middle state S2y of the RF signal 138A. In the illustration, remaining data is the same as that within the HF recipe used to generate the recipe signal 136A. To further illustrate, the user increases the duty cycle of the middle state S2y to be between one and three times a duty cycle of the state S1y. As another further illustration, the user increases the duty cycle of the middle state S2y to be equal to the duty cycle of the state S1y or to be three times the duty cycle of the state S1y. As yet another further illustration, the user increases the duty cycle of the middle state S2y to be between four and five times the duty cycle of the state S1y. As still another further illustration, the user increases the duty cycle of the middle state S2y to be equal to four times the duty cycle of the state S1y or to be equal to five times the duty cycle of the state S1y. The user provides the additional HF recipe to the processor 112 via the input device. The processor 112 stores the additional HF recipe in the memory device 114.

As another example, the processor 112 modifies a parameter level or a duty cycle or both the parameter level and the duty cycle of the middle state S2y between the two states of the RF signal 138A. To illustrate, the processor 112 increases or decreases a parameter level of the middle state S2y of the RF signal 138A. In the illustration, remaining data is the same as that within the HF recipe used to generate the recipe signal 136A. To further illustrate, the processor 112 sets the parameter level of the middle state S2y to be between 100 and 300 watts. As another illustration, the processor 112 increases or decreases a duty cycle of the middle state S2y of the RF signal 138A. In the illustration, remaining data is the same as that within the HF recipe used to generate the recipe signal 136A. To further illustrate, the processor 112 increases the duty cycle of the middle state S2y to be between one and three times a duty cycle of the state S1y. As another further illustration, the processor 112 increases the duty cycle of the middle state S2y to be equal to the duty cycle of the state S1y or to be three times the duty cycle of the state S1y. As yet another further illustration, the processor 112 increases the duty cycle of the middle state S2y to be between four and five times the duty cycle of the state S1y. As still another further illustration, the processor 112 increases the duty cycle of the middle state S2y to be equal to four times the duty cycle of the state S1y or to be equal to five times the duty cycle of the state S1y. The processor 112 stores the additional HF recipe in the memory device 114.

Also, upon changing the recipe of the RF signal 138A to provide the additional HF recipe, the LF recipe of the RF signal 139A is modified by the user or by the processor 112 to output an additional LF recipe. For example, the user modifies a duty cycle of a state S1x of the RF signal 139A to be equal to the duty cycle of the state S1y within the additional HF recipe. In the example, parameter levels and frequency within the additional LF recipe are the same as the parameter levels and frequency within the LF recipe used to generate the RF signal 139A. Also, in the example, the user does not modify any other data, such as parameter levels, within the LF recipe. In the example, the user provides the additional LF recipe to the processor 112 via the input device. In the example, the processor 112 stores the additional LF recipe in the memory device 114. As another example, the processor 112 modifies a duty cycle of a state S1x of the RF signal 139A to be equal to the duty cycle of the state S1y within the additional HF recipe. In the example, parameter levels and frequency within the additional LF recipe are the same as the parameter levels and frequency within the LF recipe used to generate the RF signal 139A. Also, in the example, the processor 112 does not modify any other data, such as parameter levels, within the LF recipe. In the example, the processor 112 stores the additional LF recipe in the memory device 114

In addition to modifying the HF recipe of the RF signal 138A and modifying the LF recipe of the RF signal 139A, the substrate S is placed back on top of the substrate support 116 via the slot 129. Upon receiving the additional HF recipe, the processor 112 generates a recipe signal 136B based on the additional HF recipe and sends the recipe signal 136B to the HF RF generator. Similarly, in response to receiving the additional LF recipe, the processor 112 generates a recipe signal 137B based on the additional LF recipe and sends the recipe signal 137B to the LF RF generator.

Upon receiving the recipe signal 136B, the HF RF generator generates an RF signal 138B based on the additional HF recipe. For example, the RF signal 138B has a different parameter level, such as a higher parameter level or a lower parameter level, for the state S2y than a parameter level for the state S2y of the RF signal 138A. The HF RF generator supplies the RF signal 138B via the output O2 and the RF cable RFC2 and the input I2 to the match 104.

Similarly, upon receiving the recipe signal 137B, the LF RF generator generates an RF signal 139B based on the additional LF recipe. For example, the RF signal 139B has a duty cycle for the state S1x and the duty cycle is equal to a duty cycle of the state S1y of the RF signal 138B. The LF RF generator supplies the RF signal 139B via the output O1 and the RF cable RFC1 and the input I1 to the match 104.

The match 104 receives the RF signals 138B and 139B, and matches an impedance of the load coupled to the output OM with the impedance of the source coupled to the input I2. The impedance matching modifies impedances of the RF signals 138B and 139B to output a modified RF signal 140B at the output OM. The modified RF signal 140B is sent from the output OM via the RF transmission line RFT to the lower electrode of the substrate support 116.

When the one or more process gases are provided to the gap 120 within the plasma chamber 106 in addition to the modified RF signal 140B, the substrate S is further processed within the plasma chamber 106. Upon processing the substrate S for a precalculated amount of time, such as 15 minutes or 20 minutes, the substrate S is removed from the plasma chamber 106 via the slot 129 and is then placed under the electron microscope 110 to be examined ex-situ by the user. When the substrate S is placed under the electron microscope 110, an image is generated or captured by the electron microscope 110 and displayed by the processor 112 on the display device of the host computer 108.

It is determined whether an amount of clogging of the mask layer of the substrate S is greater than the predetermined clog amount or a shape of a profile of the mask layer is of the predetermined shape or a combination thereof. For example, the user decides, from the displayed image, whether an amount of clogging of the mask layer of the substrate S is greater than the predetermined clog amount. In the example, upon determining that the amount of clogging is less than the predetermined clog amount, the user does not modify the additional HF recipe of the RF signal 138B. Also, in the example, the processor 112 stores the additional HF recipe of the RF signal 138B in the memory device 118. On the other hand, in the example, upon determining that the amount of clogging is not less than, such as equal to or greater than, the predetermined clog amount, the user further modifies the additional HF recipe of the RF signal 138B. In such a manner, in the example, the user continues the modify recipes of RF signals generated by the HF RF generator until the amount of clogging is less than the predetermined clog amount.

As another example, the user decides, from the displayed image, whether the shape of the profile of the mask layer of the substrate S is of the predetermined shape. In the example, upon deciding that the shape of the profile is of the predetermined shape, the user does not modify the additional HF recipe of the RF signal 138B. Also, in the example, the processor 112 stores the additional HF recipe of the RF signal 138B in the memory device 118. On the other hand, in the example, upon deciding that the shape of the profile is not of the predetermined shape, the user further modifies the additional HF recipe of the RF signal 138B. In such a manner, in the example, the user continues the modify recipes of RF signals generated by the HF RF generator until the shape of the profile is of the predetermined shape.

As yet another example, the processor 112 determines, from the captured image, whether an amount of clogging of the mask layer of the substrate S is greater than the predetermined clog amount. In the example, upon determining that the amount of clogging is less than the predetermined clog amount, the processor 112 does not modify the additional HF recipe of the RF signal 138B. Also, in the example, the processor 112 stores the additional HF recipe of the RF signal 138B in the memory device 118. On the other hand, in the example, upon determining that the amount of clogging is not less than, such as equal to or greater than, the predetermined clog amount, the processor 112 further modifies the additional HF recipe of the RF signal 138B. In such a manner, in the example, the processor 112 continues the modify recipes of RF signals generated by the HF RF generator until the amount of clogging is less than the predetermined clog amount.

As another example, the processor 112 determines, from the captured image, whether the shape of the profile of the mask layer of the substrate S is of the predetermined shape. In the example, upon determining that the shape of the profile is of the predetermined shape, the processor 112 does not modify the additional HF recipe of the RF signal 138B. Also, in the example, the processor 112 stores the additional HF recipe of the RF signal 138B in the memory device 118. On the other hand, in the example, upon determining that the shape of the profile is not of the predetermined shape, the processor 112 further modifies the additional HF recipe of the RF signal 138B. In such a manner, in the example, the processor 112 continues the modify recipes of RF signals generated by the HF RF generator until the shape of the profile is of the predetermined shape.

Figure 2A:
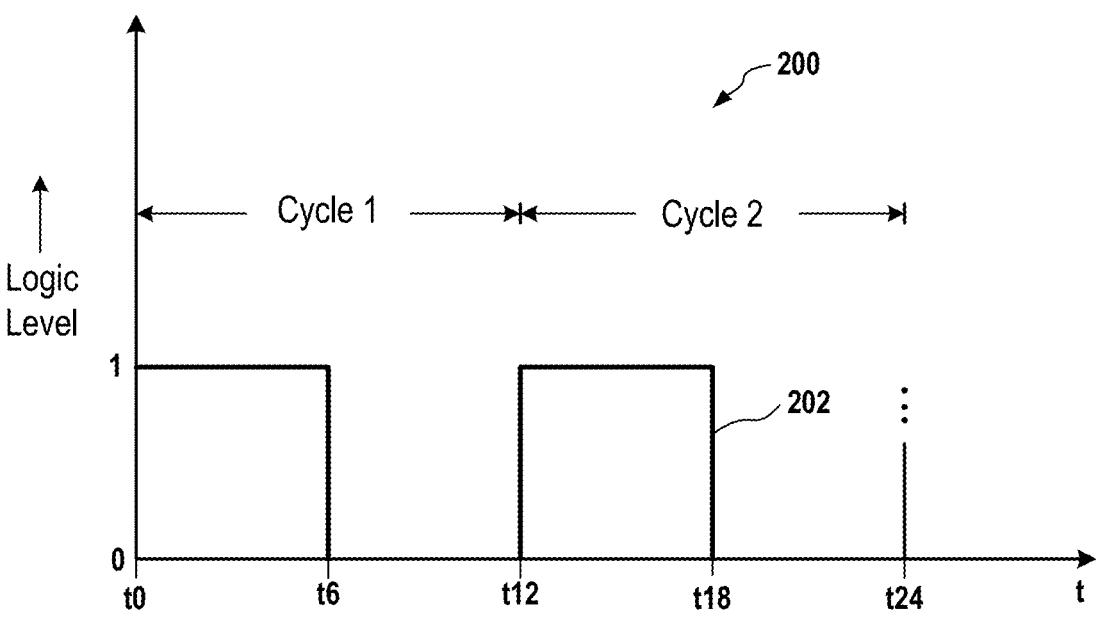
FIG. 2A is a diagram of an embodiment of a graph to illustrate a clock signal with which RF signals are synchronized.

FIG. 2A is a diagram of an embodiment of a graph 200 to illustrate a clock signal 202 with which RF signals, such as the RF signals 102, 138A, 138B, 130, 139A, and 139B (FIG. 1), are synchronized. As an example, the clock signal 202 is generated by the processor 112 (FIG. 1), and sent to the LF and HF RF generators. As another example, the clock signal 202 is generated by a digital signal processor (DSP) of the LF RF generator and sent from the DSP of the LF RF generator to a DSP of the HF RF generator. The DSP of the LF RF generator is coupled to the DSP of the HF RF generator. As yet another example, the clock signal 202 is generated by the DSP of the HF RF generator and sent from the DSP of the HF RF generator to the DSP of the LF RF generator.

The graph 200 plots a logic level of the clock signal 202 versus time t. The logic level, such as a voltage level, is plotted on a y-axis and the time t is plotted on an x-axis. The x-axis is divided into equal time intervals. For example, the x-axis is divided into equal time intervals between two consecutive times, such as a time to and t(a+1), where a is an integer at equal to zero. To illustrate, the x-axis is divided into a first time interval between the time t0 and the time t1 and a second time interval between the time t1 and the time t2. The first time interval is equal to the second time interval.

During a cycle 1 of the clock signal 202, the clock signal 202 transitions, at the time t0, from a logic level of zero to a logic level of one, and remains at the logic level of one from the time t0 to the time t6. Also, during the cycle 1 of the clock signal 202, the clock signal 202 transitions, at the time t6, from the logic level of one to the logic level of zero, and remains at the logic level of zero from the time t6 to the time t12.

Similarly, during a cycle 2 of the clock signal 202, the clock signal 202 transitions, at the time t12, from the logic level of zero to the logic level of one, and remains at the logic level of one from the time t12 to the time t18. Also, during the cycle 2 of the clock signal 202, the clock signal 202 transitions, at the time t18, from the logic level of one to the logic level of zero, and remains at the logic level of zero from the time t18 to the time t24.

The cycle 2 is consecutive to the cycle 1. For example, there are no other cycles of the clock signal 202 between the cycles 1 and 2.

Figure 2B:
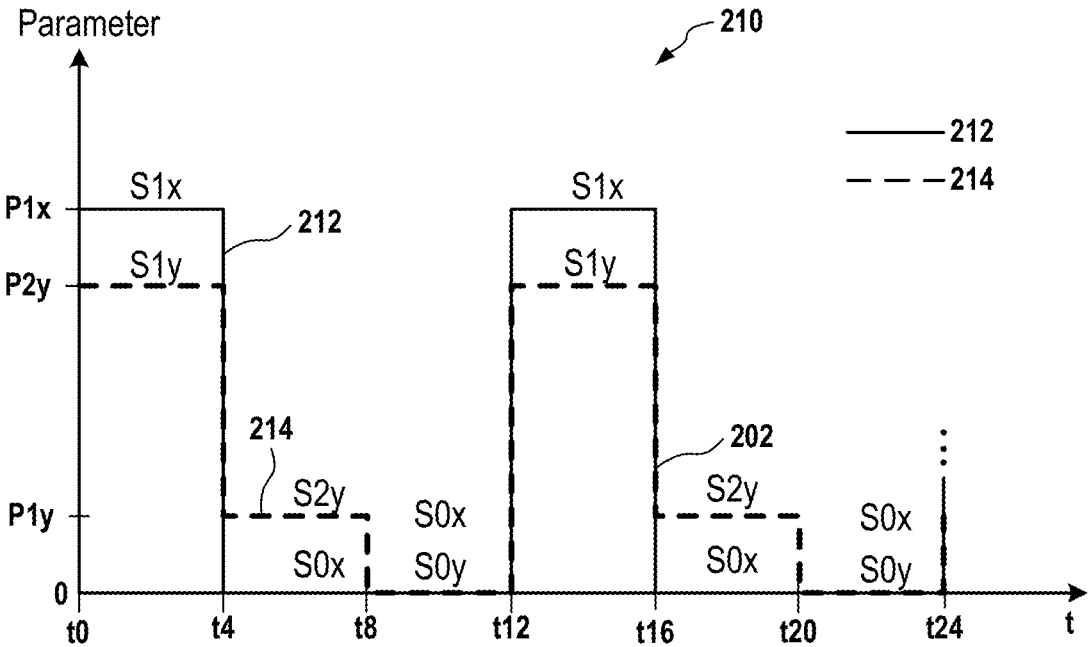
FIG. 2B is an embodiment of a graph to illustrate a parameter of a low frequency (LF) RF signal that is generated by a LF RF generator and a parameter of an HF RF signal that is generated by the HF RF generator.

FIG. 2B is an embodiment of a graph 210 to illustrate a parameter 212 of a LF RF signal, such as the RF signal 139A or 139B (FIG. 1), that is generated by the LF RF generator (FIG. 1) and a parameter 214 of a HF RF signal, such as the RF signal 138A or 138B (FIG. 1), that is generated by the HF RF generator (FIG. 1). The graph 210 plots a parameter versus the time t. The parameter is plotted on a y-axis and the time t is plotted on an x-axis. The parameter 212 is plotted as a solid line and the parameter 214 is plotted as a dashed line.

During the cycle 1, the parameter 212 transitions, at the time t0, from a parameter level of zero to a parameter level of P1x and remains at the parameter level P1x from the time t0 to the time t4. The parameter level P1x is an example of the state S1x of the LF RF signal. Also, during the cycle 1, at the time t4, the parameter 212 transitions from the parameter level P1x to the parameter level of zero and remains at the parameter level of zero from the time t4 to the time t12. The parameter level of zero of the LF RF signal is an example of the state S0x of the LF RF signal. The parameter level P1x is greater than the parameter level of zero.

Moreover, during the cycle 1, the parameter 214 transitions, at the time t0, from a parameter level of zero to a parameter level of P2y and remains at the parameter level P2y from the time t0 to the time t4. The parameter level P2y is an example of the state S1y of the HF RF signal. Also, during the cycle 1, at the time t4, the parameter 214 transitions from the parameter level P2y to a parameter level P1y and remains at the parameter level P1y from the time t4 to the time t8. The parameter level P1y is lower than or less than the parameter level P2y. The parameter level P1y is an example of the state S2y of the HF RF signal.

The parameter 212 transitions from the parameter level P1x to the parameter level of zero synchronous with or in synchronization with the transition of the parameter 214 from the parameter level P2y to the parameter level P1y. For example, the parameter 212 starts transitioning from the parameter level P1x to the parameter level of zero at the same time t4 at which the parameter 214 starts transitioning from the parameter level P2y to the parameter level P1y. As another example, the parameter 212 transitions from the parameter level P1x to the parameter level of zero at the same time t4 at which the parameter 214 transitions from the parameter level P2y to the parameter level P1y. As yet another example, the parameter 212 transitions from the parameter level P1x to the parameter level of zero during the same time period in which the parameter 214 transitions from the parameter level P2y to the parameter level P1y. As another example, the parameter 212 transitions from the parameter level P1x to the parameter level of zero concurrent with the transition of the parameter 214 from the parameter level P2y to the parameter level P1y Furthermore, during the cycle 1, the parameter 214 transitions, at the time t8, from the parameter level P1y to the parameter level of zero and remains at the parameter level of zero from the time t8 to the time t12. The parameter level of zero of the HF RF signal is an example of the state S0y of the HF RF signal.

The parameter 212 periodically repeats transitioning between the parameter levels P1x and zero during each cycle of the clock signal 202 (FIG. 2A). For example, during cycle 2, at the time t12, the parameter 212 transitions from the parameter level of zero to the parameter level P1x, remains at the parameter level P1x from the time t12 to the time t16, transitions at the time t16 from the parameter level P1x to the parameter level of zero, and remains the parameter level of zero from the time t16 to the time t24.

The parameter 214 periodically repeats transitioning among the parameter levels P2y, P1y, and zero during each cycle of the clock signal 202 (FIG. 2A). For example, during the cycle 2, at the time t12, the parameter 214 transitions from the parameter level of zero to the parameter level P2y, remains at the parameter level P2y from the time t12 to the time t16, transitions at the time t16 from the parameter level P2y to the parameter level P1y, remains the parameter level P1y from the time t16 to the time t20, transitions at the time t20 from the parameter level P1y to the parameter level of zero, and remains at the parameter level of zero from the time t20 to the time t24.

As an example, a parameter level of a parameter of an RF signal is a zero-to-peak envelope of the RF signal and is distinct from another parameter level of the RF signal. To illustrate, a first parameter level of the parameter of the RF signal includes one or more values, such as amplitudes or magnitudes, of the parameter and a second parameter level of the parameter of the RF signal includes one or more values, such as amplitudes or magnitudes, of the parameter. The one or more values of the first parameter level are exclusive of the one or more values of the second parameter level. To further illustrate, when the first parameter level is greater than the second parameter level, a minimum of the values of the first parameter level is greater than a maximum of the values of the second parameter level.

It should be noted that during a time period between the times t8 and t12 during the cycle 1, a deposition operation occurs on side walls of a mask layer of the substrate S. Furthermore, during a time period between the times t4 and t8 of the cycle 1, a trade-off between the CD of the mask layer and clogging of the mask layer occurs. For example, there is a reduction in an amount of clogging and an increase in the CD of the mask layer when the parameter level P1y is applied. Also, during a time period between the times t0 and t4, an etch operation for etching features within the substrate S occurs smoothly due to the trade-off that occurs between the times t4 and t8. Similarly, the etch operation, the trade-off, and the deposition operation repeat in that order during the cycle 2.

In one embodiment, instead of transitioning to the parameter level of zero during the time interval between the times t8 and t12, the parameter 214 transitions to a low parameter level, different from zero. For example, the low parameter level of the parameter 214 is within 5-10% from the zero parameter level. The low parameter level of the parameter 214 is lower than the parameter level P1y. Similarly, the parameter 214 transitions to the low parameter level during the cycle 2 and onwards.

In an embodiment, instead of transitioning to the parameter level of zero during the time interval between the times t4 and t12, the parameter 212 transitions to a low parameter level, which is different from zero. For example, the low parameter level of the parameter 212 is within 5-10% from the zero parameter level. The low parameter level of the parameter 212 is lower than the parameter level P1x. Similarly, the parameter 212 transitions to the low parameter level during the cycle 2 and onwards.

Figure 2C:
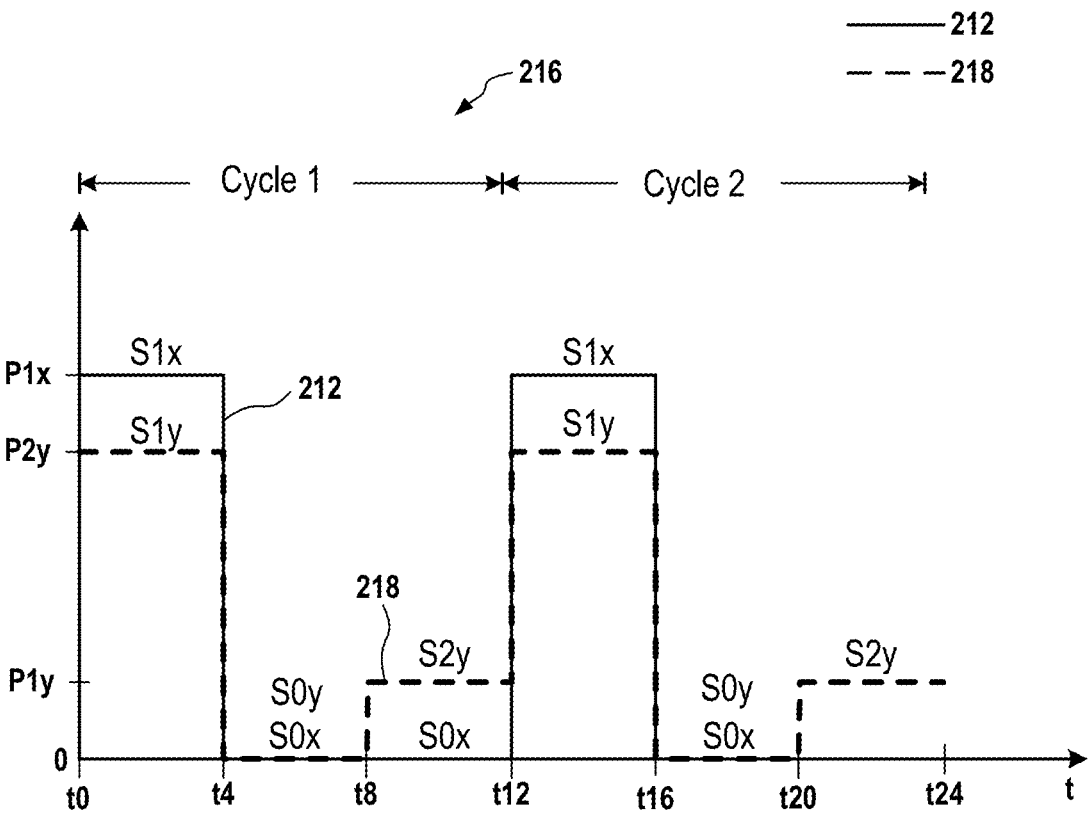
FIG. 2C is an embodiment of a graph to illustrate the parameter of the LF RF signal and the parameter of the HF RF signal.

FIG. 2C is an embodiment of a graph 216 to illustrate the parameter 212 of the LF RF signal and a parameter 218 of the HF RF signal that is generated by the HF RF generator (FIG. 1). The graph 216 plots the parameter versus the time t. The parameter is plotted on a y-axis and the time t is plotted on an x-axis in the graph 216. The parameter 212 plotted as a solid line and the parameter 218 is plotted as a dashed line.

During the cycle 1, the parameter 218 transitions, at the time t0, from the parameter level of zero to the parameter level of P2y and remains at the parameter level P2y from the time t0 to the time t4. The parameter level P2y of the parameter 218 is an example of the state S1y of the HF RF signal. Also, during the cycle 1, at the time t4, the parameter 218 transitions from the parameter level P2y to the parameter level of zero and remains at the parameter level of zero from the time t4 to the time t8. The parameter level of zero is an example of the state S0y. The state S0y is of the parameter 218 of the HF RF signal.

The parameter 212 transitions from the parameter level P1x to the parameter level of zero synchronous with or in synchronization with the transition of the parameter 218 from the parameter level P2y to the parameter level of zero. For example, the parameter 212 starts transitioning from the parameter level P1x to the parameter level of zero at the same time t4 at which the parameter 218 starts transitioning from the parameter level P2y to the parameter level of zero.

As another example, the parameter 212 transitions from the parameter level P1x to the parameter level of zero at the same time t4 at which the parameter 218 transitions from the parameter level P2y to the parameter level of zero. As yet another example, the parameter 212 transitions from the parameter level P1x to the parameter level of zero during the same time period in which the parameter 218 transitions from the parameter level P2y to the parameter level of zero. As another example, the parameter 212 transitions from the parameter level P1x to the parameter level of zero concurrent with the transition of the parameter 218 from the parameter level P2y to the parameter level of zero.

Furthermore, during the cycle 1, the parameter 218 transitions, at the time t8, from a parameter level of zero to the parameter level P1y and remains at the parameter level P1y from the time t8 to the time t12. The parameter level P1y of the HF RF signal is an example of the state S2y of the parameter 218 of the HF RF signal.

The parameter 218 periodically repeats transitioning among the parameter levels P2y, zero, and P1y during each cycle of the clock signal 202 (FIG. 2A). For example, during the cycle 2, at the time t12, the parameter 218 transitions from the parameter level of zero to the parameter level P2y, remains at the parameter level P2y from the time t12 to the time t16, transitions at the time t16 from the parameter level P2y to the parameter level of zero, remains the parameter level of zero from the time t16 to the time t20, transitions at the time t20 from the parameter level of zero to the parameter level P1y, and remains at the parameter level P1y from the time t20 to the time t24.

It should be noted that during a time period between the times t4 and t8 during the cycle 1, the deposition operation occurs on the side walls of the mask layer of the substrate S. Furthermore, during a time period between the times t8 and t12 of the cycle 1, the trade-off between the CD of the mask layer and clogging of the mask layer occurs. Also, during a time period between the times t0 and t4, the etch operation occurs smoothly due to the trade-off that occurs between the times t8 and t12. Similarly, the etch operation, the deposition operation, and the trade-off repeat in that order during the cycle 2.

In one embodiment, instead of the LF RF generator, a direct current (DC) generator is used. The DC generator generates a DC signal that pulses between two parameter levels. For example, the DC signal pulses between two power levels, such as the power level P1x and zero, in the same manner in which an RF signal generated by the LF RF generator pulses between the two power levels. The DC generator is another example of the primary generator.

In one embodiment, instead of transitioning to the parameter level of zero during the time interval between the times t4 and t8, the parameter 218 transitions to a low parameter level, different from zero. For example, the low parameter level of the parameter 218 is within 5-10% from the zero parameter level. The low parameter level of the parameter 218 is lower than the parameter level P1y. Similarly, the parameter 218 transitions to the low parameter level during the cycle 2 and onwards.

FIG. 3A is a diagram of an embodiment of a system 300 to illustrate that once the additional HF recipe of the recipe signal 136B is determined, the additional HF recipe is applied to one or more substrates during processing of the substrates. The system 300 includes the host computer 108, the LF RF generator, the HF RF generator, the match 104, and the plasma chamber 106. A substrate S1 is placed on the substrate support 116 and lies within the gap 120 formed between the upper electrode 118 and the substrate support 116.

The processor 112 sends the recipe signal 137B to the LF RF generator and sends the recipe signal 136B to the HF RF generator. The LF RF generator stores the additional LF recipe received within the recipe signal 137B. Also, the HF RF generator stores the additional HF recipe received within the recipe signal 136B.

After sending the recipe signals 137B and 136B, the processor 112 generates and sends a trigger signal 302 to the LF RF generator and to the HF RF generator. An example of the trigger signal 302 is a digital pulse. To illustrate, the trigger signal 302 has a single pulse.

Upon receiving the trigger signal 302, the LF RF generator generates the RF signal 137B based on the additional LF recipe. Also, in response to receiving the trigger signal 302, the HF RF generator generates the RF signal 138B based on the additional HF recipe.

The modified RF signal 140B is generated in the same manner as that described above with reference to FIG. 1 from the RF signals 138A and 139B. The modified RF signal 140B when supplied with the one or more process gases to the plasma chamber 106 strikes or maintains plasma within the plasma chamber 106. The plasma processes the substrate S1. In a similar manner, when the substrate S1 is replaced with another substrate, the modified RF signal 140B is provided again at the output OM to process the other substrate.

Figure 3B:
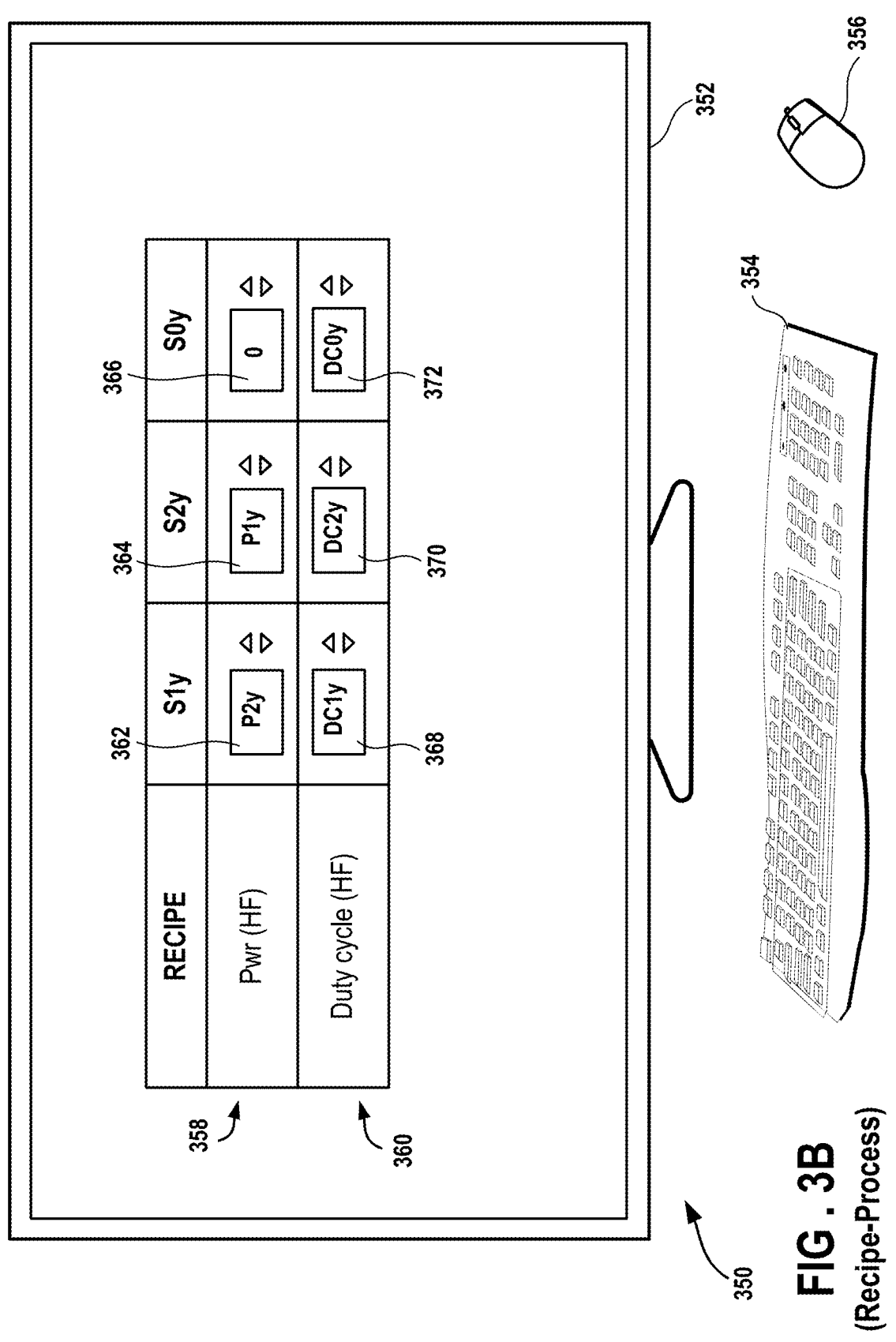
FIG. 3B is a diagram of an embodiment of a desktop computer for selection of the parameter level and the duty cycle.

FIG. 3B is a diagram of an embodiment of a desktop computer 350, which is an example of the host computer 108 (FIG. 1). The desktop computer 350 illustrates a selection or an entry of the additional HF recipe, which includes the power level P2y for the state S1y, the power level P1y for the state S2y, and the power level of zero for the states S0y. Moreover, the desktop computer 350 illustrates a selection of a duty cycle for the state S1y and a duty cycle for the state S2y.

The desktop computer 350 includes a monitor 352, a keyboard 354, and a mouse 356. The keyboard 354 and the mouse 356 are coupled to the monitor 352. For example, the keyboard 354 and the mouse 356 are coupled to a CPU of the monitor 352 via wireless connections.

Within a housing of the monitor 352, the CPU, a graphical processing unit (GPU), and a memory device are located. An example of the CPU is the processor 112 (FIG. 1) and an example of the memory device is the memory device 114 (FIG. 1). The monitor 352 includes a display screen, which is a part of the display device, referred to above.

The GPU displays a row 358 having fields 362, 364, and 366 for receiving multiple power levels for the states S1y, S2y, and S0y. Moreover, the GPU displays another row 360 having fields 368 and 370 for receiving duty cycles for the states S1y and S2y.

The user selects an up/down button displayed beside the field 362 to select the power level P2y for the state S1y of the RF signal 138B (FIG. 3A). For example, the user selects a button on the input device to select the up/down button displayed beside the field 362. Similarly, the user selects another up/down button that is displayed next to the field 364 to select the power level P1y for the state S2y of the RF signal 138B and selects an up/down button rendered next to the field 366 to select the power level of zero for the state S0y of the RF signal 138B. To illustrate, the user selects the power level P1y to be between 100 and 1000 watts. To further illustrate, the user selects the power level P1y to be 100 watts or 200 watts or 250 watts or 300 watts.

In addition, the user selects an up/down button displayed next to the field 368 to select the duty cycle DC1y for the state S1y and selects another up/down button rendered besides the field 370 to select the duty cycle DC2y for the state S2y. As an example, the user selects the duty cycle DC2y to be between one and three times the duty cycle DC1y. As another example, user selects the duty cycle DC2y to be equal to the duty cycle DC1y or to be twice the duty cycle DC1y or to be three times the duty cycle DC1y.

Upon receiving the selection of the duty cycles DC1y and DC2y, the CPU of the desktop computer 350 calculates a duty cycle DC0y for the state S0y of the RF signal 138B. For example, the CPU determines the duty cycle DC0y as a difference between 100 percent and a sum of the duty cycles DC1y and DC2y. Each of the duty cycles DC1y and DC2y is a corresponding percentage of a total time period of a cycle of the clock signal 202 (FIG. 2A). For example, the duty cycle DC1y is a first percentage of the total time period and the duty cycle DC2y is a second percentage of the total time period. The duty cycles DC1y, DC2y, and D0y are portions of the additional HF recipe. Also, upon receiving the selection of the duty cycle DC1y, the CPU of the desktop computer 350 matches the duty cycle for the state S1x of the RF signal 139B to be equal to the duty cycle DC1y of the RF signal 138B.

In one embodiment, the monitor 352 displays various recipes for processing substrates within the plasma chamber 106 (FIG. 3A) and one of the recipes includes the additional HF recipe. The user selects, via the input device, the additional HF recipe. Upon receiving the selection of the additional HF recipe, the CPU of the desktop computer 350 generates the trigger signal 302 (FIG. 3A) and sends the trigger signal 302 to the HF RF generator for execution of the additional HF recipe.

FIG. 4 is a diagram of an embodiment of the LF RF generator and the HF RF generator to illustrate details of the RF generators. The LF RF generator includes a digital signal processor (DSP) DSPx, a parameter controller PS1x, a parameter controller PS0x, a duty cycle controller DCC1x, a duty cycle controller DCC0x, a frequency controller Fx, a driver DRVRx, and a power supply PSx. The HF RF generator includes a digital signal processor DSPy, multiple parameter controllers PS1y, PS2y, and PS0y, and multiple duty cycle controllers DCC1y, DCC2y, and DCC0y. The HF RF generator further includes a frequency controller Fy, a driver DRVRy, and a power supply PSy. A frequency controller is sometimes referred to herein as an auto-frequency tuner (AFT).

Examples of a controller, as used herein, include a processor and a memory device. The processor of the controller is coupled to the memory device of the controller. To illustrate, a controller is a microcontroller or an integrated controller, which is integrated within an ASIC or a PLD. Examples of an auto-frequency tuner, as used herein, include a processor and a memory device. The processor of the auto-frequency tuner is coupled to the memory device of the auto-frequency tuner. Examples of a driver, as used herein, include one or more transistors. The one or more transistors are coupled to each other. An example of an RF power supply includes an electronic oscillator, which is an electronic circuit that produces a periodic, oscillating electronic signal, such as a sine wave.

The digital signal processor DSPx is coupled to the processor 112. The digital signal processor DSPx is coupled to the frequency controller Fx, the duty cycle controllers DCC1x and DCC0x, and the parameter controllers PS1x and PS0x. Each duty cycle controller of the LF RF generator is coupled to a corresponding parameter controller of the LF RF generator. For example, the duty cycle controller DCC1x is coupled to the parameter controller PS1x and the duty cycle controller DCC0x is coupled to the parameter controller PS0x. The controllers PS1x, PS0x, and Fx are coupled to the driver DRVRx, which is coupled to the RF power supply PSx. The RF power supply PSx is coupled to the RF cable RFC1 at the output O1. The duty cycle controller DCC1x is coupled to the duty cycle controller DCC0x.

Similarly, the digital signal processor DSPy is coupled to the processor 112. The digital signal processor DSPy is coupled to the parameter controllers PS1y, PS2y, and PS0y, to the duty cycle controllers DCC1y, DCC2y, and DCC0y, and to the frequency controller Fy.

Each duty cycle controller DCC0y, DC2y, and DC0y is coupled to a corresponding one of the parameter controllers PS1y, PS2y, and PS0y. For example, the duty cycle controller DCC1y is coupled to the parameter controller PS1y, the duty cycle controller DCC2 is coupled to the parameter controller PS2y, and the duty cycle controller DCC0y is coupled to the parameter controller PS0y. The parameter controllers PS1y, PS2y, and PS0y, and the frequency controller Fy are coupled to the driver DRVRy, which is coupled to the RF power supply PSy. The RF power supply PSy is coupled to the RF cable RFC2 at the output O2. The duty cycle controller DCC1y is coupled to the duty cycle controller DCC2y and the duty cycle controller DCC2y is coupled to the duty cycle controller DCC0y.

The processor 112 embeds recipe information for the three states S1y, S2y, and S0y within a recipe signal 402, such as the recipe signal 136A or 136B (FIG. 1). For example, the processor 112 assigns an identifier for each of the three states S1y, S2y, and S0y. In the example, the identifier for each of the three states is sometimes referred to herein as an HF state identifier. Also, in the example, the processor 112 identifies whether the recipe information for the three states S1y, S2y, and S0y is a parameter level, a frequency, or a duty cycle for a state. In the example, the processor 112 further includes within the recipe signal 402 an order, such as a sequence, of execution of the duty cycles for the states S1y, S2y, and S0y. To illustrate, the processor 112 assigns a first HF parameter identifier to the parameter level for the state S1y, a first HF duty cycle identifier to the duty cycle for the state S1y, and a HF frequency identifier to the frequency of the HF RF generator. Also, in the illustration, the processor 112 assigns a second HF parameter identifier to the parameter level for the state S2y and a second HF duty cycle identifier to the duty cycle for the state S2y. In the illustration, the processor 112 assigns a third HF parameter identifier to the parameter level for the state S0y and a third HF duty cycle identifier to the duty cycle for the state S0y. Further, in the illustration, the order includes that the state S1y is to be executed before the state S2y, which is to be executed before the state S0y.

The digital signal processor DSPy receives the recipe signal 402 and extracts recipe information from the recipe signal 402. For example, the digital signal processor DSPy determines from the three HF state identifiers that the recipe information within the recipe signal 402 includes information regarding the three states S1y, S2y, and S0y. To illustrate, the digital signal processor DSPy determines whether the recipe signal 402 includes information regarding a parameter level for each state S1y, S2y, and S0y, or a duty cycle for the state, or a frequency for the state. Continuing with the illustration, the digital signal processor DSPy determines based on the HF parameter identifier for a state that the recipe signal 402 includes a parameter level for the state. Similarly, in the illustration, the digital signal processor DSPy determines based on the HF duty cycle identifier for a state that the recipe signal 402 includes a duty cycle for the state. Also, in the illustration, the digital signal processor DSPy determines based on the HF frequency identifier for a state that the recipe signal 402 includes a frequency for the state. In the illustration, the digital signal processor DSPy identifies the order of execution of the duty cycles for the states S1y, S2y, and S0y from the recipe signal 402.

The digital signal processor DSPy sends the recipe information for each state to a corresponding one of the controllers PS1y, PS2y, PS0y, DCC1y, DCC2y, DCC0y, and Fcy. For example, the digital signal processor DSPy sends a parameter level for the state S1y to the parameter controller PS1y, sends a parameter level for the state S2y to the parameter controller PS2y, and sends a parameter level for the state S0y to the parameter controller PS0y. Also, in the example, the digital signal processor DSPy sends a duty cycle for the state S1y to the duty cycle controller DCC1y, sends a duty cycle for the state S2y to the duty cycle controller DCC2y, and sends a duty cycle for the state S0y to the duty cycle controller DCC0y. Furthermore, in the example, the digital signal processor DSPy sends the frequency for the three states S1y, S2y, and S0y to the frequency controller Fy. In the example, digital signal processor DSPy sends the order of execution of the duty cycle for the state S1y to the duty cycle controller DCC1y, for the state S2y to the duty cycle controller DCC2y, and for the state S0y to the duty cycle controller DCC0y.

Each controller within the HF RF generator stores a portion of the recipe information received from the digital signal processor DSPy. For example, a processor of the parameter controller PS1y stores the parameter level for the state S1y within a memory device of the parameter controller PS1y. Continuing with the example, a processor of the parameter controller PS2y stores the parameter level for the state S2y within a memory device of the parameter controller PS2y. Also, in the example, a processor of the parameter controller PS0y stores the parameter level for the state S0y within a memory device of the parameter controller PS0y. Moreover, in the example, a processor of the duty cycle controller DCC1y stores the duty cycle and the order of execution for the state S1y within a memory device of the duty cycle controller DCC1y. Furthermore, in the example, a processor of the duty cycle controller DCC2y stores the duty cycle and the order of execution for the state S2y within a memory device of the duty cycle controller DCC2y. In the example, a processor of the duty cycle controller DCC0y stores the duty cycle and the order of execution for the state S0y within a memory device of the duty cycle controller DCC0y. Also, in the example, a processor of the frequency controller FCy stores the frequency for the states S1y, S2y, and S0y within a memory device of the frequency controller FCy.

In response to receiving the trigger signal 302, the digital signal processor DSPy sends, at a start of each pulse of a cycle of the clock signal 202 (FIG. 2), an instruction to each of the controllers DCC1y, DCC2y, DCC0y, and Fy. Upon receiving the instruction, each duty cycle controller DCC1y, DCC2y, and DC0y sends a command to a corresponding parameter controller PS1y, PS2y, and PS0y according to the order of execution to generate an instruction signal for a time period within the duty cycle. For example, in response to receiving the instruction, the duty cycle controller DCC1y sends, at a first time T1, a command to the parameter controller PS1y to generate an instruction signal based on the parameter level for the state S1y, and the instruction signal is to be generated for a time period TP1y within the duty cycle for the state S1y. Similarly, in the example, upon receiving the instruction, the duty cycle controller DCC2y waits for the time period TP1y and sends, at a second time T2, a command to the parameter controller PS2y to generate an instruction signal based on the parameter level for the state S2y, and the instruction signal is to be generated for a time period TP2y within the duty cycle for the state S2y. In the example, the command is sent to the parameter controller PS2y to transition the HF RF signal from the parameter level for the state S1y to the parameter level for the state S2y. Also, in the example, the time period TP1y is sent from the duty cycle controller DCC1y to the duty cycle controller DCC2y. Further, in the example, upon receiving the instruction, the duty cycle controller DCC0y waits for the time period TP2y and sends, at a third time T3, a command to the parameter controller PS0y to generate an instruction signal based on the parameter level for the state S0y, and the instruction signal is to be generated for a time period within the duty cycle for the state S0y. In the example, the command is sent to the parameter controller PS0y to transition the HF RF signal from the parameter level for the state S2y to the parameter level for the state S0y. In the example, the time period TP2y is sent from the duty cycle controller DCC2y to the duty cycle controller DCC0y. In the example, the third time follows the second time, which follows the first time. The second time occurs immediately after the first time and the time period TP1 and the third time occurs immediately after the second time and the time period TP2.

In response to receiving the instruction from the digital signal processor DSPy, the frequency controller FCy generates an instruction signal based on a frequency of the states S1y, S2y, and S0y, and sends the instruction signal to the driver DRVRy. Upon receiving the instruction signals for the state S1y, S2y, and S0y from the controllers P1y, PS2y, and PS0y and FCy, the driver DRVRy generates a current signal based on the instruction signals and sends the current signal to the power supply PSy. When the current signal is received from the driver DRVRy, the power supply PSy generates an RF signal 404 based on the current signal. An example of the RF signal 404 is the RF signal 138A (FIG. 1). Another example of the RF signal 404 is the RF signal 138B (FIG. 1). The RF signal 404 is supplied by the power supply PSy at the output O2 for transfer via the RF cable RFC2.

It should be noted that when the recipe signal 132 having two states instead of three is sent from the processor 112 to the digital signal processor DSPy, the digital signal processor DSPy does not send information within the recipe signal 132 regarding the state S2y to the controllers PS2y and DCC2y. There is no parameter level for the state S2y to be sent to the parameter controller PS2y and no duty cycle for the state S2y to be sent to the duty cycle controller DCC2y.

The processor 112 embeds recipe information for the two states S1x and S0x within a recipe signal 403, such as the recipe signal 137A or 137b (FIG. 1). For example, the processor 112 assigns an identifier for each of the two states S1x and S0x. The identifier for each of the two states S1x and S0x is sometimes referred to herein as a LF state identifier. Also, in the example, the processor 112 identifies whether the recipe information for the two states S1x and S0x is a parameter level, a frequency, or a duty cycle for a state. In the example, the processor 112 further includes within the recipe signal 403 an order, such as a sequence, of execution of the duty cycles for the states S1x and S0x. To illustrate, the processor 112 assigns a first LF parameter identifier to the parameter level for the state S1x, a first LF duty cycle identifier to the duty cycle for the state S1x, and a LF frequency identifier to the frequency of the LF RF generator. Also, in the illustration, the processor 112 assigns a second LF parameter identifier to the parameter level for the state S0x and a second LF duty cycle identifier to the duty cycle for the state S0x. In the illustration, the order includes that the state S1x is to be executed before the state S0x.

The digital signal processor DSPx receives the recipe signal 403 and extracts recipe information from the recipe signal 403. For example, the digital signal processor DSPx determines from the two LF state identifiers that the recipe information within the recipe signal 403 includes information regarding the two states S1x and S0x. In the example, upon determining so, the digital signal processor DSPx determines whether the recipe signal 403 includes information regarding a parameter level for each state S1x and S0x, or a duty cycle for the state, or a frequency for the state. Continuing with the example, the digital signal processor DSPx determines based on the LF parameter identifier for a state that the recipe signal 403 includes a parameter level for the state. Similarly, in the example, the digital signal processor DSPx determines based on the LF duty cycle identifier for a state that the recipe signal 403 includes a duty cycle for the state. Also, in the example, the digital signal processor DSPx determines based on the LF frequency identifier for a state that the recipe signal 403 includes a frequency for the state. In the example, the digital signal processor DSPx identifies the order of execution of the duty cycles for the states S1x and S0x from the recipe signal 403.

The digital signal processor DSPx sends the recipe information for each state to a corresponding one of the controllers PS1x, PS2x, and Fx. For example, the digital signal processor DSPx sends a parameter level for the state S1x to the parameter controller PS1x, sends a parameter level for the state S0x to the parameter controller PS0x, and sends the frequency for the two states S1x and S0x to the frequency controller Fx. In the example, the digital signal processor DSPx sends the order of execution of the duty cycle for the state S1x to the duty cycle controller DCC1x, and for the state S0x to the duty cycle controller DCC0x.

Each controller within the LF RF generator stores a portion of the recipe information received from the digital signal processor DSPx. For example, a processor of the parameter controller PS1x stores the parameter level for the state S1x within a memory device of the parameter controller PS1x. Continuing with the example, a processor of the parameter controller PS0x stores the parameter level for the state S0x within a memory device of the parameter controller PS0x. Moreover, in the example, a processor of the duty cycle controller DCC1x stores the duty cycle and the order of execution for the state S1x within a memory device of the duty cycle controller DCC1x. Furthermore, in the example, a processor of the duty cycle controller DCC0x stores the duty cycle and the order of execution for the state S0x within a memory device of the duty cycle controller DCC0x. Also, in the example, a processor of the frequency controller FCx stores the frequency for the states S1x and S0x within a memory device of the frequency controller FCx.

In response to receiving the trigger signal 302, the digital signal processor DSPx sends, at a start of each pulse of the cycle of the clock signal 202 (FIG. 2), an instruction to each of the controllers PS1x, PS0x, DCC1x, DCC0x, and Fx. Upon receiving the instruction, each duty cycle controller DCC1x and DC0x sends a command to a corresponding parameter controller PS1x and PS0x according to the order of execution to generate an instruction signal for a time period within the duty cycle. For example, in response to receiving the instruction, the duty cycle controller DCC1x sends, at the first time T1, a command to the parameter controller PS1x to generate an instruction signal based on the parameter level for the state S1x, and the instruction signal is to be generated for the time period TP1y within the duty cycle for the state S1x. Similarly, in the example, upon receiving the instruction, the duty cycle controller DCC0x waits for the time period TP1y and sends, at the second time T2, a command to the parameter controller PS0x to generate an instruction signal based on the parameter level for the state S0x, and the instruction signal is to be generated for a time period within the duty cycle for the state S0x. In the example, the time period TP1y is sent from the duty cycle controller DCC1y to the duty cycle controller DCC0x. Also, in the example, the command is sent to the parameter controller PS0x to transition the LF RF signal from the parameter level for the state S1x to the parameter level for the state S0x. In the example, when the command is sent to the parameter controller PS0x at the second time T2, an RF signal 405, generated by the LF RF generator, transitions from the parameter level for the state S1x to the parameter level for the state S0x in synchronization with the transition of the RF signal 404 from the parameter level for the state S1y to the parameter level for the state S2y.

In response to receiving the instruction from the digital signal processor DSPx, the frequency controller FCx generates an instruction signal based on a frequency of the states S1x and S0x, and sends the instruction signal to the driver DRVRx. Upon receiving the instruction signals for the states S1x and S0x from the controllers PS1x, PS0x, and FCy, the driver DRVRx generates a current signal based on the instruction signals and sends the current signal to the power supply PSx. When the current signal is received from the driver DRVRx, the power supply PSx generates the RF signal 405, such as the RF signal 139A or 139B (FIG. 1), based on the current signal. The RF signal 405 is supplied by the power supply PSx at the output O1 for transfer via the RF cable RFC1.

In one embodiment, the parameter 218 (FIG. 2C) is to be generated. In the embodiment, in response to receiving the trigger signal 302, the digital signal processor DSPy sends, at a start of each pulse of a cycle of the clock signal 202 (FIG. 2), an instruction to each of the controllers DCC1y, DCC0y, DCC2y, and Fy. Upon receiving the instruction, each duty cycle controller DCC1y, DCC0y, DCC2y sends a command to a corresponding parameter controller PS1y, PS0y, and PS2y according to the order of execution to generate an instruction signal for a time period within the duty cycle. For example, in response to receiving the instruction, the duty cycle controller DCC1y sends, at a first time T1.1, a command to the parameter controller PS1y to generate an instruction signal based on the parameter level for the state S1y, and the instruction signal is to be generated for a time period TP1.1y within the duty cycle for the state S1y. Similarly, in the example, upon receiving the instruction, the duty cycle controller DCC0y waits for the time period TP1.1y and sends, at a second time T2.1, a command to the parameter controller PS0y to generate an instruction signal based on the parameter level for the state S0y, and the instruction signal is to be generated for a time period TP2.1y within the duty cycle for the state S0y. In the example, the command is sent to the parameter controller PS0y to transition the HF RF signal from the parameter level for the state S1y to the parameter level for the state S0y. Also, in the example, the time period TP1.1y is sent from the duty cycle controller DCC1y to the duty cycle controller DCC0y.

Further, in the example, upon receiving the instruction, the duty cycle controller DCC2y waits for the time period TP2.1y and sends, at a third time T3.1, a command to the parameter controller PS2y to generate an instruction signal based on the parameter level for the state S2y, and the instruction signal is to be generated for a time period TP3.1y within the duty cycle for the state S2y. In the example, the command is sent to the parameter controller PS2y to transition the HF RF signal from the parameter level for the state S0y to the parameter level for the state S2y. In the example, the time period TP2.1y is sent from the duty cycle controller DCC0y to the duty cycle controller DCC2y. In the example, the third time follows the second time, which follows the first time. Also, in the example, the second time occurs immediately after the first time and the time period TP1.1 and the third time occurs immediately after the second time and the timer period TP2.1.

In an embodiment, the duty cycle controller DCC1x is coupled to the duty cycle controller DCC1y. The processor of the duty cycle controller DCC1x accesses the duty cycle for the state S1y from the memory device of the duty cycle controller DCC1y. Upon accessing the duty cycle for the state S1y, the processor of the duty cycle controller DCC1x determines whether the duty cycle for the state S1x matches the duty cycle for the state DC1y. Upon determining that the duty cycles for the states S1x and S1y do not match, the processor of the duty cycle controller DCC1x controls the duty cycle for the state S1x to match the duty cycle for the state S1y. On the other hand, upon determining that the duty cycles for the states S1x and S1y match, the processor of the duty cycle controller DCC1x does not control the duty cycle for the state S1x to match the duty cycle for the state S1y.

Figures 5A, 5B, 5C:
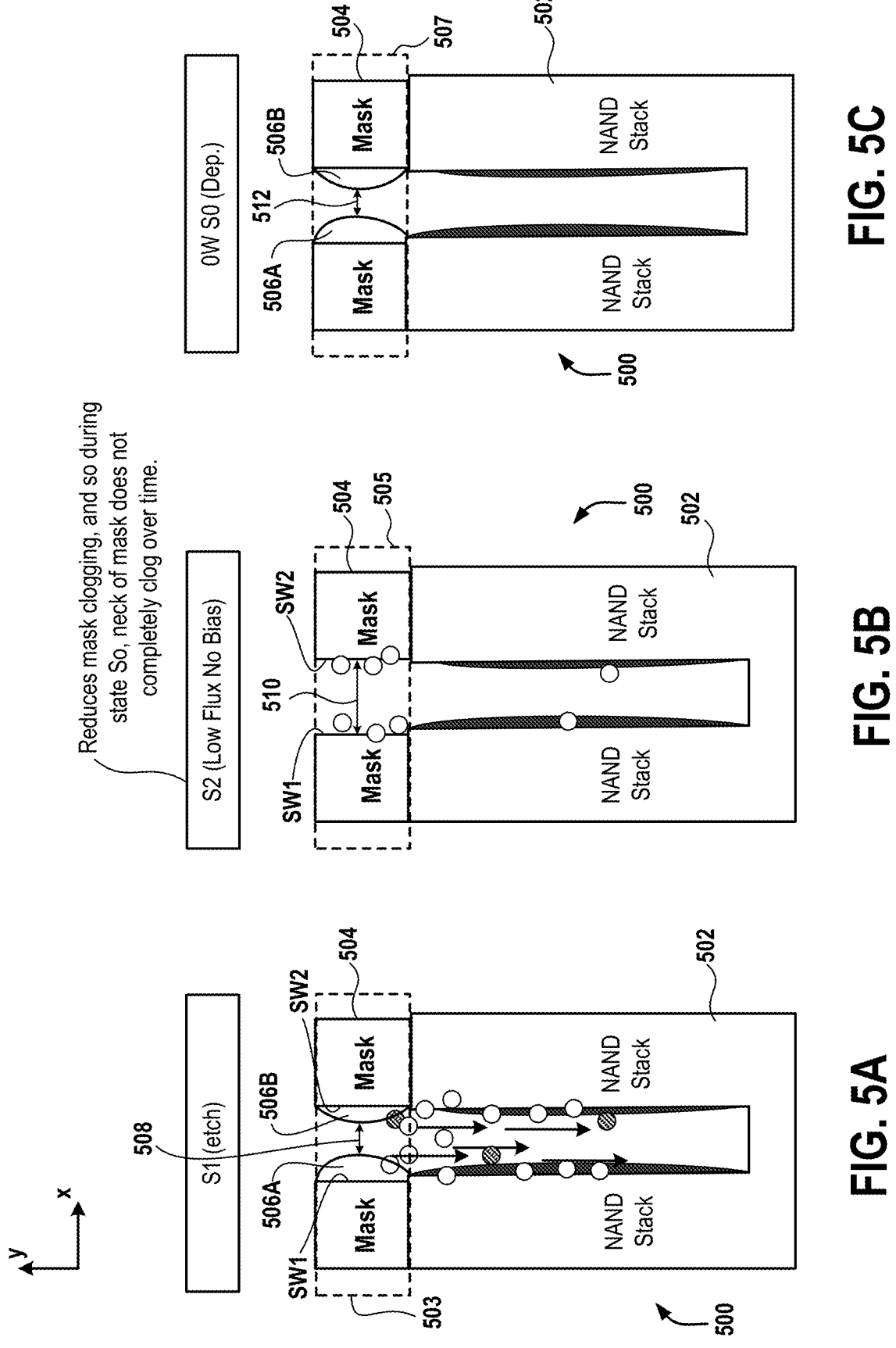
FIG. 5A is a diagram of an embodiment of a substrate to illustrate an effect of an etch operation performed during states S1y and S1x on a substrate.
FIG. 5B is a diagram of an embodiment of the substrate to illustrate an effect of states S2y and S0x on the substrate.
FIG. 5C is a diagram of an embodiment of the substrate to illustrate an effect of states S0y and S0x on the substrate.

FIG. 5A is a diagram of an embodiment of a substrate 500 to illustrate an effect of an etch operation performed during the states S1y and S1x on the substrate 500. The substrate 500 is an example of the substrate S (FIG. 1) or the substrate S1 (FIG. 3A). The substrate 500 has a stack layer 502, such as a NAND stack, and a mask layer 504.

The mask layer 504 has a profile 503. An example of a profile of a mask layer is a side view of the mask layer. The side view is a two-dimensional view that illustrates a shape of the mask layer. The shape can include a height, along a y-axis, and a width, along an x-axis. The height is in a vertical direction and the width is in a horizontal direction.

The mask layer 504 is formed on top of the stack layer 502. As an example, the stack layer 502 includes an oxide-polysilicon-oxide-polysilicon (OPOP) layer at its bottom. The stack layer 502 further has a drain-side selection gate (SGD) located on top of the OPOP layer and a nitride layer on top of the SGD layer. The mask layer 504 is formed on top of the nitride layer.

Passivation layers 506A and 506B are formed on side walls SW1 and SW2 of the mask layer 504. For example, the passivation layer 506A is adjacent to the side wall SW1 of the mask layer 504 and the passivation layer 506B is adjacent to the side wall SW2 of the mask layer 504. To illustrate, there is no layer between the passivation layer 506A and the side wall SW1 and there is no layer between the passivation layer 506B and the side wall SW2. The passivation layer 506A faces the passivation layer 506B via a gap between the passivation layers 506A and 506B. The side walls SW1 and SW2 of the mask layer 504 are sometimes referred to herein as a neck area or a neck of the substrate 500. A passivation layer includes polymeric materials deposited on a side wall of the mask layer 504. For example, the passivation layers 506A and 506B include materials of the stack layer 502 that are sputtered from etching of the stack layer 502, or materials from the process gases, or a combination thereof.

The states S1y and S1x etch the stack layer 502 and play little role in reducing the passivation layers 506A and 506B. When the passivation layers 506A and 506B are not reduced, mask clogging occur and a horizontal distance 508 between the layers 506A and 506B decreases. For example, the passivation layers 506A and 506B grow until there is no space left between the passivation layers 506A and 506B. The horizontal distance 508 is an example of a CD of the mask layer 504. During application of the states S1y and S1x, the horizontal distance 508 is a least amount of distance between the passivation layers 506A and 506B.

FIG. 5B is a diagram of an embodiment of the substrate 500 to illustrate an effect of the states S2y and S0x on the substrate 500. During a simultaneous or concurrent occurrence of the states S2y and S0x, a horizontal distance 510 between the passivation layers 506A and 506B increases compared to the horizontal distance 508 (FIG. 5A). The horizontal distance 510 is another example of a CD of the mask layer 504. During application of the states S2y and S0x, the horizontal distance 510 is a least amount of distance between the passivation layers 506A and 506B. The mask layer 504 has a profile 505.

FIG. 5C is a diagram of an embodiment of the substrate 500 to illustrate an effect of the states S0y and S0x on the substrate 500. During the states S0y and S0x, a deposition operation is performed on the substrate 500. During an occurrence of the states S0y and S0x, a horizontal distance 512 between the passivation layers 506A and 506B decreases compared to the horizontal distance 510 (FIG. 5B). The horizontal distance 512 is another example of a CD of the mask layer 504, which has a profile 507. During application of the states S0y and S0x, the horizontal distance 512 is a least amount of distance between the passivation layers 506A and 506B. By introducing the states S2y and S0x, the horizontal distance 510 is achieved and therefore, the CD of the mask layer 504 increases. The states S2y and S0x reduces chances that the mask layer 504 will be clogged by the passivation layers 506A and 506B.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for controlling a critical dimension of a mask layer of a substrate, comprising:

receiving, by a primary radio frequency (RF) generator, a first primary parameter level and a second primary parameter level;

receiving, by a secondary RF generator, a first secondary parameter level, a second secondary parameter level, and a third secondary parameter level;

generating, by the primary RF generator, a primary RF signal having the first primary parameter level, wherein the primary RF signal is a sine wave;

transitioning, by the primary RF generator during a clock cycle, the primary RF signal from the first primary parameter level to the second primary parameter level;

generating, by the secondary RF generator, a secondary RF signal having the first secondary parameter level, wherein the secondary RF signal is a sine wave;

transitioning, by the secondary RF generator, the secondary RF signal from the first secondary parameter level to the second secondary parameter level during the clock cycle;

transitioning, by the secondary RF generator, the secondary RF signal from the second secondary parameter level to the third secondary parameter level during the clock cycle, wherein said transitioning of the primary RF signal from the first primary parameter level to the second primary parameter level occurs in synchronization with said transitioning of the secondary RF signal from the first secondary parameter level to the second secondary parameter level, sending the primary RF signal from the primary RF generator to a match that is coupled to an electrode of a plasma chamber; and sending the secondary RF signal from the secondary RF generator to the match, wherein the second secondary parameter level is generated to control the critical dimension of the mask layer.

2. The method of claim 1, wherein the second secondary parameter level ranges from 100 watts to 1000 watts.

3. The method of claim 1, further comprising receiving a measurement of the critical dimension, wherein the second secondary parameter level is based on the measurement of the critical dimension.

4. The method of claim 3, wherein the measurement of the critical dimension is less than a predetermined critical dimension, the method comprising:

modifying a fourth secondary parameter level to the second secondary parameter level after receiving an indication that the measurement of the critical dimension is less than the predetermined critical dimension.

5. The method of claim 4, further comprising changing a duty cycle of the fourth secondary parameter level after receiving the indication that the measurement of the critical dimension is less than the predetermined critical dimension.

6. The method of claim 1, wherein the second secondary parameter level has a duty cycle that is one to three times a duty cycle of the first secondary parameter level.

7. The method of claim 1, wherein the second secondary parameter level has a duty cycle that is four to five times a duty cycle of the first secondary parameter level.

8. The method of claim 1, wherein the critical dimension includes a distance between a first passivation layer adjacent to the mask layer and a second passivation layer adjacent to the mask layer, wherein the first passivation layer faces the second passivation layer.

9. The method of claim 1, wherein said transitioning of the primary RF signal from the first primary parameter level to the second primary parameter level occurs in synchronization with said transitioning of the secondary RF signal from the first secondary parameter level to the second secondary parameter level when said transitioning of the primary RF signal from the first primary parameter level to the second primary parameter level is controlled to be initiated at the same time as said transitioning of the secondary RF signal from the first secondary parameter level to the second secondary parameter level.

10. The method of claim 1, wherein during the third secondary parameter level and a first portion of the second primary parameter level, a deposition operation occurs on the mask layer, wherein during the second secondary parameter level and a second portion of the second primary parameter level, a trade-off between the critical dimension and clogging of the mask layer occurs, wherein during the first primary parameter level and the first secondary parameter level, the substrate is etched.

11. The method of claim 1, wherein the second secondary parameter level is lower than the first secondary parameter level and the third secondary parameter level is lower than the second secondary parameter level.

12. The method of claim 1, wherein the third secondary parameter level is zero.

13. The method of claim 1, wherein the second secondary parameter level is lower than the first secondary parameter level and the third secondary parameter level is greater than the second secondary parameter level.

14. The method of claim 1, wherein the second secondary parameter level is zero.

* * * * *